US008642365B2

(12) United States Patent
Yagi

(10) Patent No.: US 8,642,365 B2
(45) Date of Patent: Feb. 4, 2014

(54) METHOD OF MANUFACTURING RIDGE-TYPE SEMICONDUCTOR LASER

(75) Inventor: Hideki Yagi, Yokohama (JP)

(73) Assignee: Sumitomo Electric Industries Ltd, Osaka (JP)

(*) Notice: Subject to any disclaimer, the term of this patent is extended or adjusted under 35 U.S.C. 154(b) by 119 days.

(21) Appl. No.: 13/443,944

(22) Filed: Apr. 11, 2012

(65) Prior Publication Data

US 2012/0270347 A1    Oct. 25, 2012

(30) Foreign Application Priority Data

Apr. 19, 2011  (JP) ................ 2011-093072

(51) Int. Cl.
*H01L 21/00* (2006.01)
(52) U.S. Cl.
USPC ................ 438/31; 438/29; 438/32
(58) Field of Classification Search
USPC .......................................... 438/31
See application file for complete search history.

(56) References Cited

U.S. PATENT DOCUMENTS

| 2001/0019567 A1* | 9/2001 | Orita et al. ............. 372/46 |
| 2001/0048114 A1* | 12/2001 | Morita et al. ............. 257/103 |
| 2002/0018499 A1* | 2/2002 | Kuniyasu et al. ............. 372/36 |
| 2011/0305255 A1* | 12/2011 | Ishimura et al. ............. 372/50.1 |

OTHER PUBLICATIONS

Mothi Madhan Raj et al., "High-Reflectivity Semiconductor/Benzocyclobutene Bragg Reflector Mirrors for GaInAsP/InP Lasers", Japanese Journal of Applied Physics, The Japan Society of Applied Physics, Apr. 2001, vol. 40, pp. 2269-2277, Part 1, No. 4A.
T. Okamoto et al., "Monolithic Integration of a 10Gb/s Mach-Zehnder Modulator and a Widely Tunable Laser based on a 2-Ring Loop-Filter", 2010 International Conference on Indium Phosphide and Related Materials, IEEE, 2010, pp. 390-393 (ThA1-3).

* cited by examiner

*Primary Examiner* — Ajay K Arora
(74) *Attorney, Agent, or Firm* — Smith, Gambrell & Russell, LLP

(57) ABSTRACT

A method of manufacturing a ridge-type semiconductor laser includes the steps of forming a stacked semiconductor layer including an active layer and an etch stop layer on first and second surfaces of a substrate, etching the stacked semiconductor layer on the second surface, forming a semiconductor portion on the second surface, forming a ridge waveguide portion by etching the stacked semiconductor layer on the first surface to a first depth, forming semiconductor diffraction grating portions by etching the semiconductor portion to a second depth, and forming a diffraction grating section by providing resin diffraction grating portions between the semiconductor diffraction grating portions. The etching of the stacked semiconductor layer on the first surface and the etching of the semiconductor portion are performed simultaneously by using first and second mask portions.

12 Claims, 24 Drawing Sheets

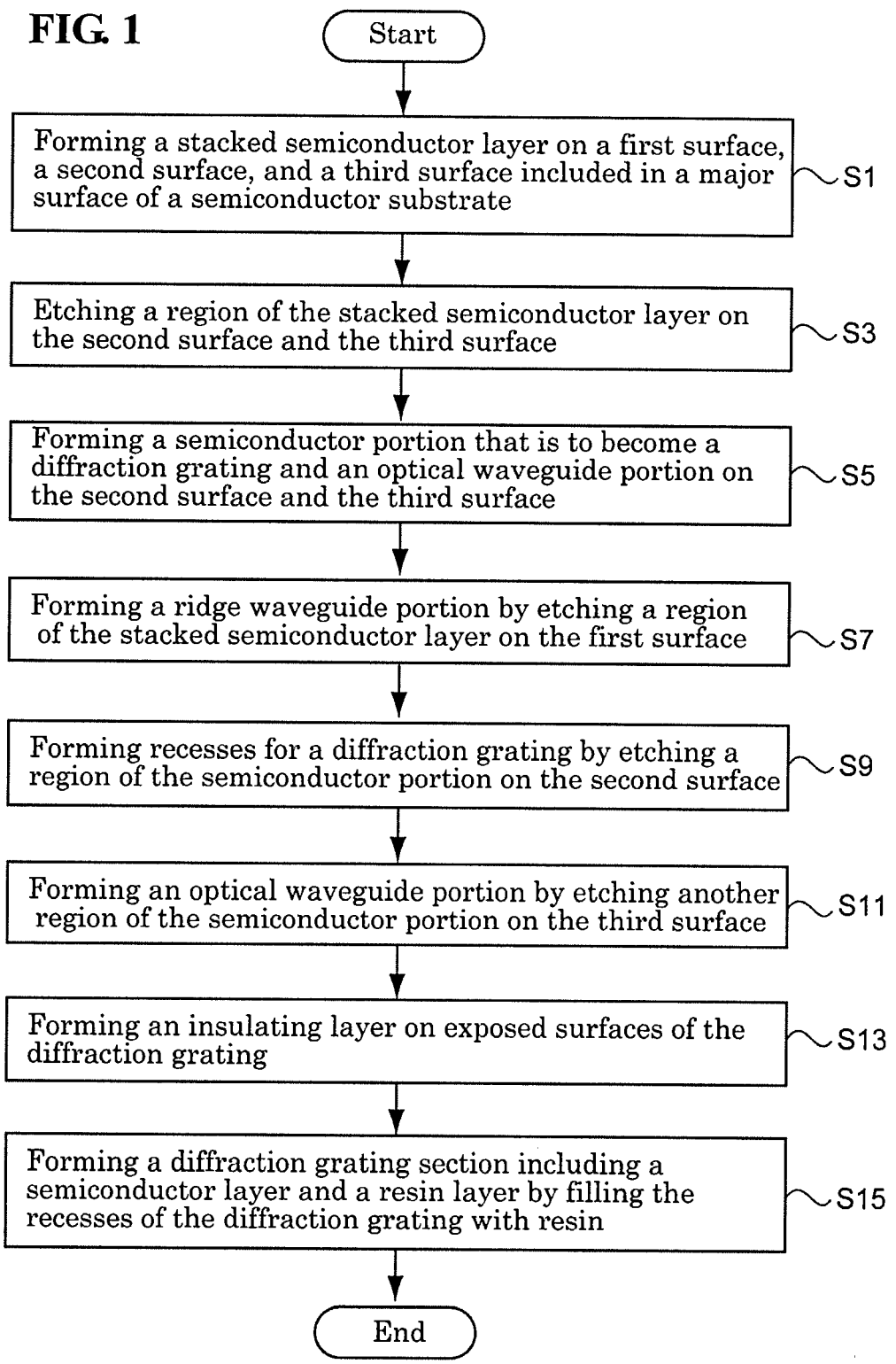

FIG. 3
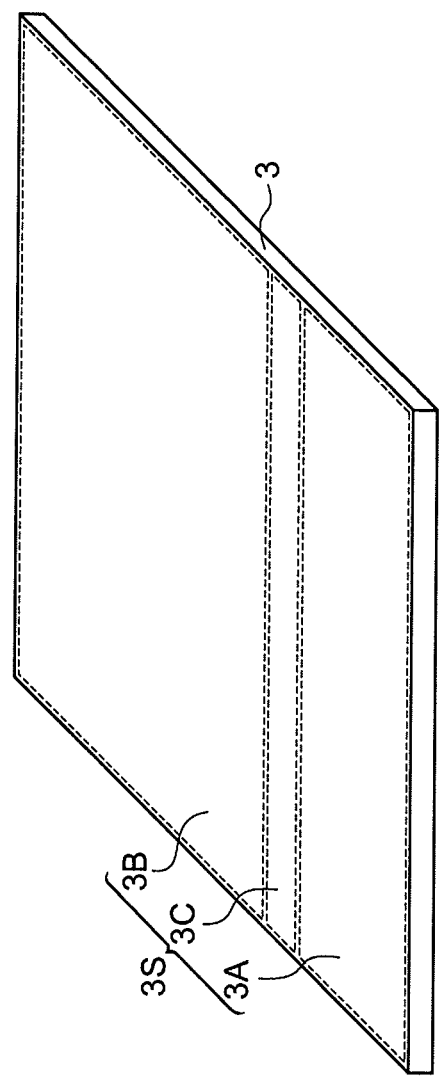
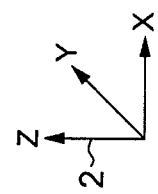

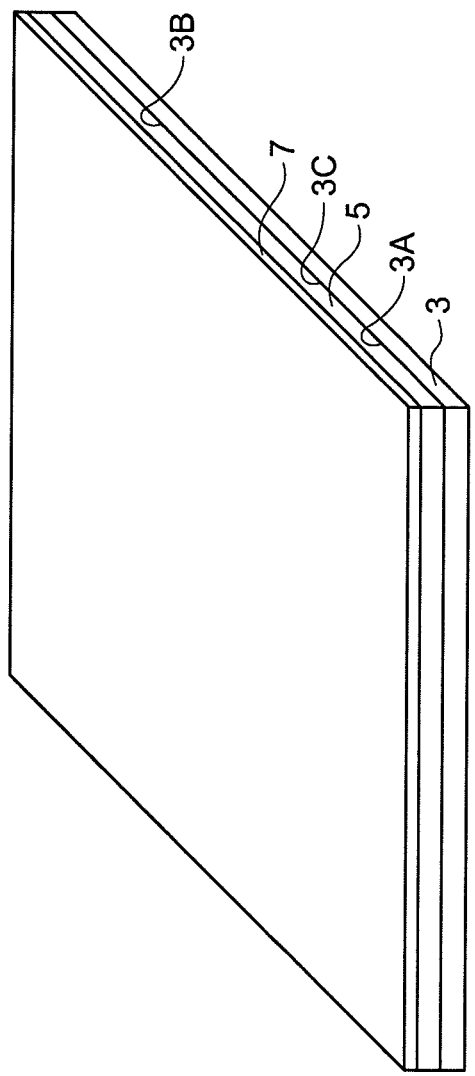
FIG. 4
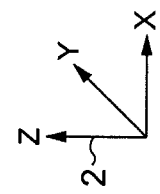

US 8,642,365 B2

METHOD OF MANUFACTURING RIDGE-TYPE SEMICONDUCTOR LASER

BACKGROUND OF THE INVENTION

1. Field of the Invention

The present invention relates to a method of manufacturing a ridge-type semiconductor laser.

2. Description of the Related Art

A method of manufacturing a distributed Bragg reflector (DBR) laser diode is discussed by M. M. Raj et al. in "High-Reflectivity Semiconductor/Benzocyclobutene Bragg Reflector Mirrors for GaInAsP/InP Lasers" (Japanese Journal of Applied Physics, The Japan Society of Applied Physics, April 2001, Vol. 40, pp. 2269-2277, Part 1, No. 4A). In this method, a stacked semiconductor layer including an active layer is first formed on an entire surface of a semiconductor substrate. Subsequently, a titanium (Ti) mask for defining a semiconductor laser portion and a DBR mirror is formed by an electron beam exposure technique and a lift-off process. Subsequently, the stacked semiconductor layer is etched by using the Ti mask as an etching mask. Thus, a semiconductor laser portion and a DBR mirror are provided on the semiconductor substrate. According to this method, the semiconductor laser portion and the DBR mirror have identical stacked-semiconductor-layer structures on the semiconductor substrate.

A semiconductor integrated device in which a ridge-type semiconductor laser portion and a filter portion that includes ring resonators and so forth are integrated is discussed by T. Okamoto et al. in "Monolithic Integration of a 10 Gb/s Mach-Zehnder Modulator and a Widely Tunable Laser based on a 2-Ring Loop Filter" (2010 International Conference on Indium Phosphide and Related Materials, IEEE, 2010, pp. 390-393 (ThA1-3)). This document also concerns a method of manufacturing a semiconductor integrated device in which a stacked semiconductor layer including an active layer and provided on a semiconductor substrate is etched twice. According to this method, in a first etching step, a first region of the stacked semiconductor layer is etched to a first depth in such a manner as to form a pair of stripe grooves, whereby a ridge waveguide portion is provided. Thus, a ridge-type semiconductor laser portion is provided. Subsequently, in a second etching step, a second region of the stacked semiconductor layer adjacent to the first region is etched to a second depth larger than the first depth into a certain shape, whereby a filter portion having a mesa-shape is provided.

In the DBR semiconductor laser discussed in "High-Reflectivity Semiconductor/Benzocyclobutene Bragg Reflector Mirrors for GaInAsP/InP Lasers", the DBR mirror includes the active layer having the same configuration as the active layer of the semiconductor laser portion. Therefore, some of light produced in the semiconductor laser is absorbed by the active layer of the DBR mirror. Accordingly, the reflectivity of the DBR mirror is reduced. Consequently, there arise problems such as a reduction in the output power of the semiconductor laser and an increase in the threshold current.

Moreover, methods of manufacturing ridge-type semiconductor lasers are particularly complicated, and it is difficult to accurately align the semiconductor laser portion and the DBR mirror. Specifically, such a method of manufacturing a semiconductor laser includes, for example, a step of forming a stacked semiconductor layer on an entire surface of a semiconductor substrate, a step of forming a ridge waveguide portion by etching a region of the stacked semiconductor layer that is to become the semiconductor laser portion, and a step of forming a DBR mirror having a periodical structure by etching another region of the stacked semiconductor layer that is to become the DBR mirror.

The ridge waveguide portion needs to be provided in a region above the active layer of the semiconductor laser portion. On the other hand, the DBR mirror needs to be provided in a region including a part at the same level as the active layer of the semiconductor laser portion to reflect light emitting from the active layer. Therefore, the etching depth of the stacked semiconductor layer required in the step of forming the ridge waveguide portion differs from the etching depth of the stacked semiconductor layer required in the step of forming the DBR mirror. Hence, it is difficult to perform these steps simultaneously in one etching step.

Accordingly, the step of forming the ridge waveguide portion and the step of forming the DBR mirror tend to be performed in two separate etching steps, similarly to the method of manufacturing a semiconductor integrated device including a ridge-type semiconductor laser portion and a filter portion that includes ring resonators and so forth discussed in "Monolithic Integration of a 10 Gb/s Mach-Zehnder Modulator and a Widely Tunable Laser based on a 2-Ring Loop Filter". Consequently, the method becomes complicated. Moreover, misalignment between the mask used in the first etching step and the mask used in the second etching step is often occurred. Consequently, it is difficult to accurately align the ridge-type semiconductor laser portion and the DBR mirror.

SUMMARY OF THE INVENTION

According to a first aspect of the present invention, a method of manufacturing a ridge-type semiconductor laser includes the steps of forming a stacked semiconductor layer on a semiconductor substrate having a major surface including a first surface and a second surface that are provided in that order in a waveguiding direction, the stacked semiconductor layer including an active layer and an etch stop layer provided above the active layer; etching at least a portion of the etch stop layer and a portion of the active layer of the stacked semiconductor layer formed on the second surface; forming a semiconductor portion on the second surface where the stacked semiconductor layer is etched off; forming a ridge waveguide portion in the stacked semiconductor layer by etching a region of the stacked semiconductor layer formed on the first surface to a first depth reaching the etch stop layer; forming a plurality of semiconductor diffraction grating portions by etching a region of the semiconductor portion formed on the second surface to a second depth larger than the first depth, the plurality of semiconductor diffraction grating portions being formed periodically in the waveguiding direction; and forming a diffraction grating section including the plurality of semiconductor diffraction grating portions and a plurality of resin diffraction grating portions, the plurality of resin diffraction grating portions being formed by providing a resin layer over and between the plurality of semiconductor diffraction grating portions. The step of forming the ridge waveguide portion includes forming and patterning a first mask portion on the stacked semiconductor layer, and selectively etching the stacked semiconductor layer to the etch stop layer by using the patterned first mask portion as a mask. The step of forming the semiconductor diffraction grating portions includes forming and patterning a second mask portion on the semiconductor portion, and etching the semiconductor portion by using the patterned second mask portion as a mask. The etching of the stacked semiconductor layer in the step of forming the ridge waveguide portion and the etching of the semiconductor portion in the step of forming the semiconductor diffraction grating portions are performed simultaneously. In addition, the patterning of the first mask portion in the step of forming the ridge waveguide portion and the patterning of the second mask portion in the step of forming the semiconductor diffraction grating portions may be performed simultaneously by pattern transfer from one master pattern.

In the method of manufacturing a ridge-type semiconductor laser according to the first aspect of the present invention, the depth (first depth) to which the region of the stacked semiconductor layer formed on the first surface of the semiconductor substrate is etched in the step of forming the ridge waveguide portion in the stacked semiconductor layer differs from the depth (second depth) to which the region of the semiconductor portion formed on the second surface of the semiconductor substrate is etched in the step of forming the plurality of semiconductor diffraction grating portions. Specifically, the second depth is larger than the first depth. The stacked semiconductor layer includes the etch stop layer, whereas the semiconductor portion does not include any etch stop layer. Therefore, the etching of the stacked semiconductor layer and the etching of the semiconductor portion can be performed simultaneously. That is, in the step of forming the ridge waveguide portion, the stacked semiconductor layer is selectively etched to the first depth reaching the etch stop layer. Meanwhile, the semiconductor portion, which does not include any etch stop layer, is etched to the second depth larger than the first depth. Thus, even if the etching of the stacked semiconductor layer and the etching of the semiconductor portion are performed simultaneously, the depth to which the semiconductor portion is etched (the second depth) can be made larger than the depth to which the stacked semiconductor layer is etched (the first depth).

Hence, the manufacturing method is simplified compared with a case where the second etching of the stacked semiconductor layer and the first etching of the semiconductor portion are performed separately. Furthermore, the patterning of the first mask portion performed before the etching of the stacked semiconductor layer and the patterning of the second mask portion performed before the etching of the semiconductor portion may be performed simultaneously by pattern transfer from the master pattern. Therefore, the ridge waveguide portion provided on the first surface of the semiconductor substrate and including the active layer is accurately aligned with the diffraction grating section provided on the second surface of the semiconductor substrate.

Consequently, in the method of manufacturing a ridge-type semiconductor laser according to the first aspect of the present invention, a ridge-type semiconductor laser having a deeply etched semiconductor diffraction grating is manufactured accurately and simply.

In the method of manufacturing a ridge-type semiconductor laser according to the first aspect of the present invention, the etch stop layer is preferably made of a semiconductor material different from a material of the semiconductor portion. Furthermore, the etching of the stacked semiconductor layer in the step of forming the ridge waveguide portion and the etching of the semiconductor portion in the step of forming the semiconductor diffraction grating portions may be performed by a method in which an etching rate of the etch stop layer becomes smaller than an etching rate of the semiconductor portion.

In the method of manufacturing a ridge-type semiconductor laser according to the first aspect of the present invention, the etch stop layer may be made of an aluminum-containing semiconductor material, and the semiconductor portion may be made of a non-aluminum-containing semiconductor material. Furthermore, the etching of the stacked semiconductor layer in the step of forming the ridge waveguide portion and the etching of the semiconductor portion in the step of forming the semiconductor diffraction grating portions may be performed by a reactive ion etching method with a gas mixture of methane gas and hydrogen gas. Thus, in the etching of the stacked semiconductor layer and in the etching of the semiconductor portion, the etching rate of the etch stop layer becomes smaller particularly than that of the semiconductor portion. Consequently, the simultaneous performance of the etching of the stacked semiconductor layer and the etching of the semiconductor portion is facilitated.

Preferably, the method of manufacturing a ridge-type semiconductor laser according to the first aspect of the present invention further includes a step of forming an insulating layer on exposed surfaces of the semiconductor diffraction grating portions after the step of forming the semiconductor diffraction grating portions. Thus, the insulating layer is interposed between the semiconductor diffraction grating portions and the resin diffraction grating portions. Consequently, the occurrence of peeling of the resin diffraction grating portions from the semiconductor diffraction grating portions is suppressed.

In the method of manufacturing a ridge-type semiconductor laser according to the first aspect of the present invention, in the step of forming the semiconductor diffraction grating portions, the semiconductor diffraction grating portions may be provided with a period with which the diffraction grating section functions as a second-order diffraction grating. Thus, the period of the plurality of semiconductor diffraction grating portions and the plurality of resin diffraction grating portions provided alternately in the diffraction grating section can be increased. This facilitates the manufacturing of the diffraction grating section.

In the method of manufacturing a ridge-type semiconductor laser according to the first aspect of the present invention, the etch stop layer preferably has a thickness of 100 nm or more and 150 nm or less. If the thickness of the etch stop layer is set to 100 nm or more, the layers included in the stacked semiconductor layer residing below the etch stop layer are easily prevented from being etched during the simultaneous performance of the etching of the stacked semiconductor layer in the step of forming the ridge waveguide portion and the etching of the semiconductor portion in the step of forming the semiconductor diffraction grating portions. If the thickness of the etch stop layer is set to 150 nm or less, the increase in the resistance of the stacked semiconductor layer is suppressed well.

Preferably, the method of manufacturing a ridge-type semiconductor laser according to the first aspect of the present invention further includes a step of forming a diffraction grating on the first surface. In addition, the diffraction grating has a period different from a period of the semiconductor diffraction grating portions.

According to a second aspect of the present invention, a method of manufacturing a ridge-type semiconductor laser includes the steps of forming a stacked semiconductor layer on a semiconductor substrate having a major surface including a first surface and a second surface that are provided in that order in a waveguiding direction and a third surface interposed between the first surface and the second surface, the stacked semiconductor layer including an active layer and an etch stop layer provided above the active layer; etching at least a portion of the etch stop layer and a portion of the active layer of the stacked semiconductor layer formed on the second surface and the third surface; forming a semiconductor portion on the second surface and the third surface where the stacked semiconductor layer is etched off; forming a ridge waveguide portion in the stacked semiconductor layer by etching a region of the stacked semiconductor layer formed on the first surface to a first depth reaching the etch stop layer; forming an optical waveguide portion by etching a region of the semiconductor portion formed on the third surface, the optical waveguide portion extending in the waveguiding direction; forming a plurality of semiconductor diffraction grating portions by etching a region of the semiconductor portion formed on the second surface to a second depth larger than the first depth, the plurality of semiconductor diffraction grating portions being formed periodically in the waveguiding direction; and forming a diffraction grating section including the plurality of semiconductor diffraction grating portions and a plurality of resin diffraction grating portions, the plurality of resin diffraction grating portions being formed by providing a resin layer over and between the plurality of semiconductor diffraction grating portions. The step of forming the ridge waveguide portion includes forming and patterning a first mask portion on the stacked semiconductor layer, and selectively etching the stacked semiconductor layer to the etch stop layer by using the patterned first mask portion as a mask. The step of forming the semiconductor diffraction grating portions includes forming and patterning a second mask portion on the semiconductor portion disposed on the second surface, and etching the semiconductor portion by using the patterned second mask portion as a mask. The step of forming the optical waveguide portion includes forming and patterning a third mask portion on the semiconductor portion disposed on the third surface, and etching the semiconductor portion by using the patterned third mask portion as a mask. The patterning of the first mask portion, the patterning of the second mask portion, and the patterning of the third mask portion are performed simultaneously by pattern transfer from one master pattern. The etching of the stacked semiconductor layer in the step of forming the ridge waveguide portion, the etching of the semiconductor portion in the step of forming the semiconductor diffraction grating portions, and the etching of the semiconductor portion in the step of forming the optical waveguide portion are performed simultaneously.

With the presence of the optical waveguide portion between the ridge waveguide portion and the diffraction grating section, the loss of light due to scattering is reduced. Thus, the ridge waveguide portion and the diffraction grating section are optically connected to each other with high efficiency. Consequently, a ridge-type semiconductor laser having a high optical output and a low threshold current density is provided.

Moreover, the etching of the semiconductor portion in the step of forming the optical waveguide portion is performed simultaneously with the etching of the stacked semiconductor layer in the step of forming the ridge waveguide portion and the etching of the semiconductor portion in the step of forming the semiconductor diffraction grating portions. Therefore, the ridge-type semiconductor laser is manufactured easily even with the addition of the step of forming the optical waveguide portion. Furthermore, the patterning of the third mask portion in the step of forming the optical waveguide portion is performed simultaneously with the patterning of the first mask portion and the patterning of the second mask portion by pattern transfer from the master pattern. Therefore, the ridge waveguide portion, the diffraction grating section, and the optical waveguide portion are aligned accurately even with the addition of the step of forming the optical waveguide portion. Thus, the ridge-type semiconductor laser is manufactured accurately.

In the method of manufacturing a ridge-type semiconductor laser according to the second aspect of the present invention, the etch stop layer may be made of a semiconductor material different from a material of the semiconductor portion. Furthermore, the etching of the stacked semiconductor layer in the step of forming the ridge waveguide portion, the etching of the semiconductor portion in the step of forming the semiconductor diffraction grating portions, and the etching of the semiconductor portion in the step of forming the optical waveguide portion are preferably performed by a method in which an etching rate of the etch stop layer included in the stacked semiconductor layer becomes smaller than an etching rate of the semiconductor portion.

In the method of manufacturing a ridge-type semiconductor laser according to the second aspect of the present invention, the etch stop layer is preferably made of an aluminum-containing semiconductor material, and the semiconductor portion is preferably made of a non-aluminum-containing semiconductor material. Furthermore, the etching of the stacked semiconductor layer in the step of forming the ridge waveguide portion, the etching of the semiconductor portion in the step of forming the semiconductor diffraction grating portions, and the etching of the semiconductor portion in the step of forming the optical waveguide portion may be performed by a reactive ion etching method with a gas mixture of methane gas and hydrogen gas.

In the method of manufacturing a ridge-type semiconductor laser according to the second aspect of the present invention, the first mask portion, the second mask portion, and the third mask portion may have patterns configured such that the semiconductor diffraction grating portions formed with a corresponding one of the patterns each have a length larger than a length of the ridge waveguide portion in a direction orthogonal to the waveguiding direction and such that the optical waveguide portion has a length larger than the length of the ridge waveguide portion in the direction orthogonal to the waveguiding direction.

Thus, even if the light emitted from the active layer included in the ridge waveguide portion has a size larger than the above length of the ridge waveguide portion and is guided toward the optical waveguide portion and the diffraction grating section, most of the light reaches the optical waveguide portion and the diffraction grating section. Consequently, a ridge-type semiconductor laser having a high optical output and a low threshold current density is provided.

BRIEF DESCRIPTION OF THE DRAWINGS

FIG. 1 is a flowchart illustrating a method of manufacturing a ridge-type semiconductor laser.

FIG. 3 is a perspective view illustrating the method of manufacturing a ridge-type semiconductor laser.

FIG. 4 is another perspective view illustrating the method of manufacturing a ridge-type semiconductor laser.

DESCRIPTION OF THE PREFERRED EMBODIMENTS

Figure 2A:
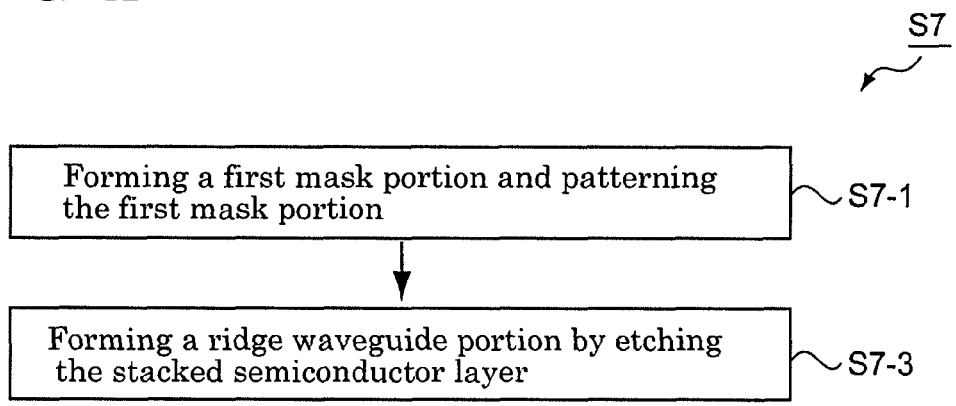
FIGS. 2A, 2B, and 2C are flowcharts illustrating sub-steps included in a ridge-waveguide-portion-forming step, a semiconductor-diffraction-grating-portion-forming step, and an optical-waveguide-portion-forming step, respectively.

A ridge-type semiconductor laser and a method of manufacturing a ridge-type semiconductor laser according to embodiments of the present invention will now be described in detail with reference to the accompanying drawings. In the drawings, like elements are denoted by like reference numerals, if possible. Individual elements and the relationship thereamong are arbitrarily scaled for ease of viewing of the drawings.

FIG. 1 is a flowchart illustrating a method of manufacturing a ridge-type semiconductor laser according to an embodiment of the present invention. As illustrated in FIG. 1, the method of manufacturing a ridge-type semiconductor laser according to the present embodiment includes steps S1 to S15. In step S1, a stacked semiconductor layer is formed on a first surface, a second surface, and a third surface included in a major surface of a semiconductor substrate (stacked-semiconductor-layer-forming step S1). In step S3, a region of the stacked semiconductor layer formed on the second surface and the third surface is etched off (first stacked-semiconductor-layer-etching step S3). In step S5, a semiconductor portion that is to become a diffraction grating and an optical waveguide portion is formed on the second surface and the third surface (semiconductor-portion-forming step S5). In step S7, a region of the stacked semiconductor layer formed on the first surface is etched, whereby a ridge waveguide portion is formed (ridge-waveguide-portion-forming step S7). In step S9, a region of the semiconductor portion formed on the second surface is etched, whereby recesses (or grooves) that are to form a diffraction grating are provided (semiconductor-diffraction-grating-portion-forming step S9). In step S11, another region of the semiconductor portion formed on the third surface is etched, whereby an optical waveguide portion is formed (optical-waveguide-portion-forming step S11). In step S13, an insulating layer is formed on exposed surfaces of the diffraction grating (insulating-layer-forming step S13). In step S15, the recesses (or grooves) of the diffraction grating made of semiconductor that have been provided in step S9 are filled with resin, whereby a diffraction grating section including a semiconductor layer and a resin layer is formed (resin-filling step S15).

Figure 2B:
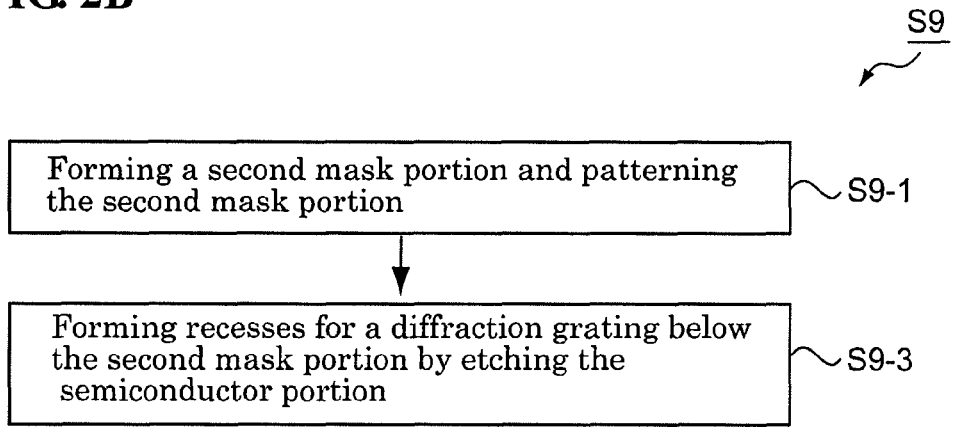
Figure 2C:
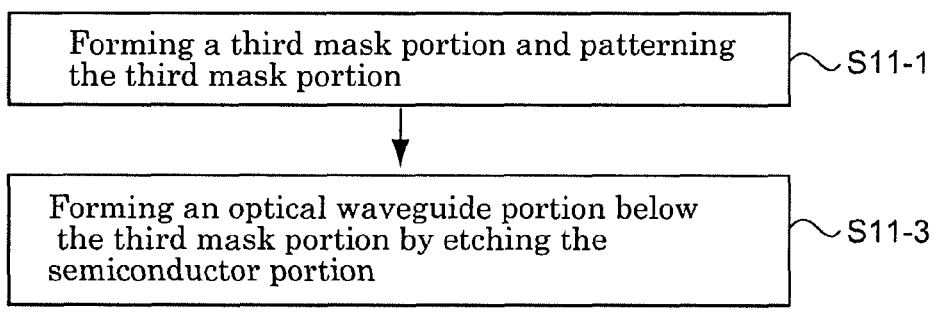

FIGS. 2A, 2B, and 2C are flowcharts illustrating sub-steps included in the ridge-waveguide-portion-forming step S7, the semiconductor-diffraction-grating-portion-forming step S9, and the optical-waveguide-portion-forming step S11, respectively. As illustrated in FIG. 2A, the ridge-waveguide-portion-forming step S7 includes step S7-1 in which a first mask portion is formed and patterned (first-mask-portion-patterning step) and step S7-3 in which the stacked semiconductor layer is etched so that a ridge waveguide portion is provided (second stacked-semiconductor-layer-etching step). As illustrated in FIG. 2B, the semiconductor-diffraction-grating-portion-forming step S9 includes step S9-1 in which a second mask portion is formed and patterned (second-mask-portion-patterning step) and step S9-3 in which the semiconductor portion is etched so that a plurality of recesses (or grooves) that are to form a diffraction grating are provided below the second mask portion (first semiconductor-portion-etching step). As illustrated in FIG. 2C, the optical-waveguide-portion-forming step S11 includes step S11-1 in which a third mask portion is formed and patterned (third-mask-portion-patterning step) and step S11-3 in which the semiconductor portion is etched so that an optical waveguide portion is formed below the third mask portion (second semiconductor-portion-etching step).

The above steps will now be described in detail. FIGS. 3 to 10, 13, 15, 17, 19, and 21 to 23 are perspective views illustrating the method of manufacturing a ridge-type semiconductor laser according to the present embodiment. FIGS. 11, 14, 16, 18, 20, and 24 are sectional views illustrating the method of manufacturing a ridge-type semiconductor laser according to the present embodiment.

Stacked-Semiconductor-Layer-Forming Step S1

First, the stacked-semiconductor-layer-forming step S1 is performed. In this step, a stacked semiconductor layer is formed on a first surface, a second surface, and a third surface included in a major surface of a semiconductor substrate. Specifically, referring to FIG. 3, a first-conducting-type (n-type, for example) semiconductor substrate 3 is prepared. The semiconductor substrate 3 is made of, for example, a III-V group compound semiconductor such as InP. The semiconductor substrate 3 has a substantially flat major surface 3S. The major surface 3S includes a first surface 3A, a second surface 3B, and a third surface 3C. The first surface 3A, the second surface 3B, and the third surface 3C are adjacent to one another in the Y-axis direction with the third surface 3C residing between the first surface 3A and the second surface 3B. The first surface 3A is an area on which a ridge-type semiconductor laser portion LD is to be formed in a later step. The second surface 3B is an area on which a distributed Bragg reflector (DBR) mirror R is to be formed in a later step. The third surface 3C is an area on which an optical waveguide portion 31B is to be formed in a later step (see FIG. 24).

An orthogonal coordinate system 2 is illustrated in FIG. 3. The X axis and the Y axis are set in respective directions parallel to the major surface 3S of the semiconductor substrate 3. The Z axis is set in a thickness direction of the semiconductor substrate 3. The orthogonal coordinate system 2 is also illustrated in FIG. 4 and the subsequent drawings in correspondence with that in FIG. 3.

Referring now to FIG. 4, a first-conducting-type lower cladding layer 5 and a first-conducting-type diffraction grating layer 7 are grown in that order on the first surface 3A, the second surface 3B, and the third surface 3C of the semiconductor substrate 3 by, for example, an epitaxial growth method such as a metal-organic vapor phase epitaxy (MOVPE) method. The lower cladding layer 5 is made of, for example, a III-V group compound semiconductor such as InP. The diffraction grating layer 7 is made of, for example, a III-V group compound semiconductor such as GaInAsP.

Figure 5:
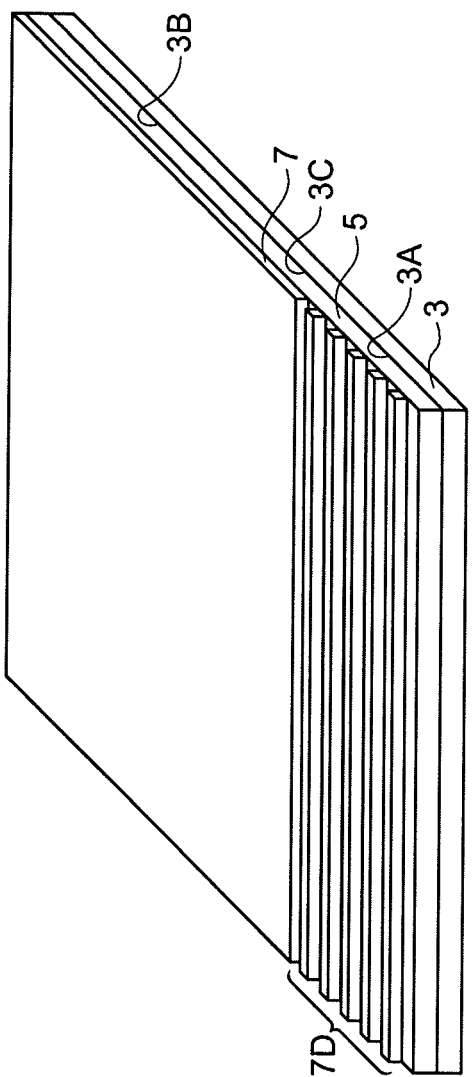
FIG. 5 is yet another perspective view illustrating the method of manufacturing a ridge-type semiconductor laser.

Subsequently, referring to FIG. 5, a diffraction grating 7D is formed in a region of the diffraction grating layer 7 residing above the first surface 3A by, for example, a typical lithography method, a nano-imprint lithography method, or the like. The diffraction grating 7D includes a line-and-space pattern in which lines and spaces are provided periodically in the Y-axis direction. The lines and spaces each extend in the X-axis direction. The period of the diffraction grating 7D is, for example, 200 nm.

Figure 8:
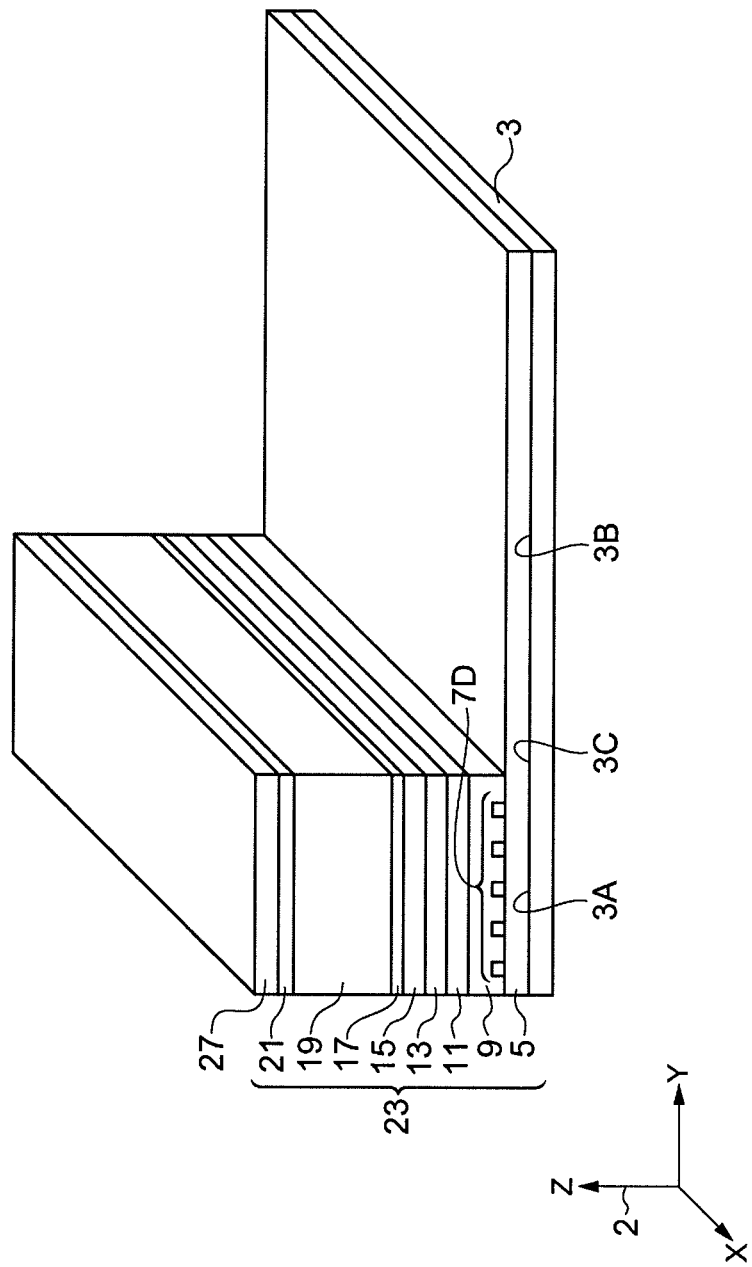
FIG. 8 is yet another perspective view illustrating the method of manufacturing a ridge-type semiconductor laser.
Figure 9:
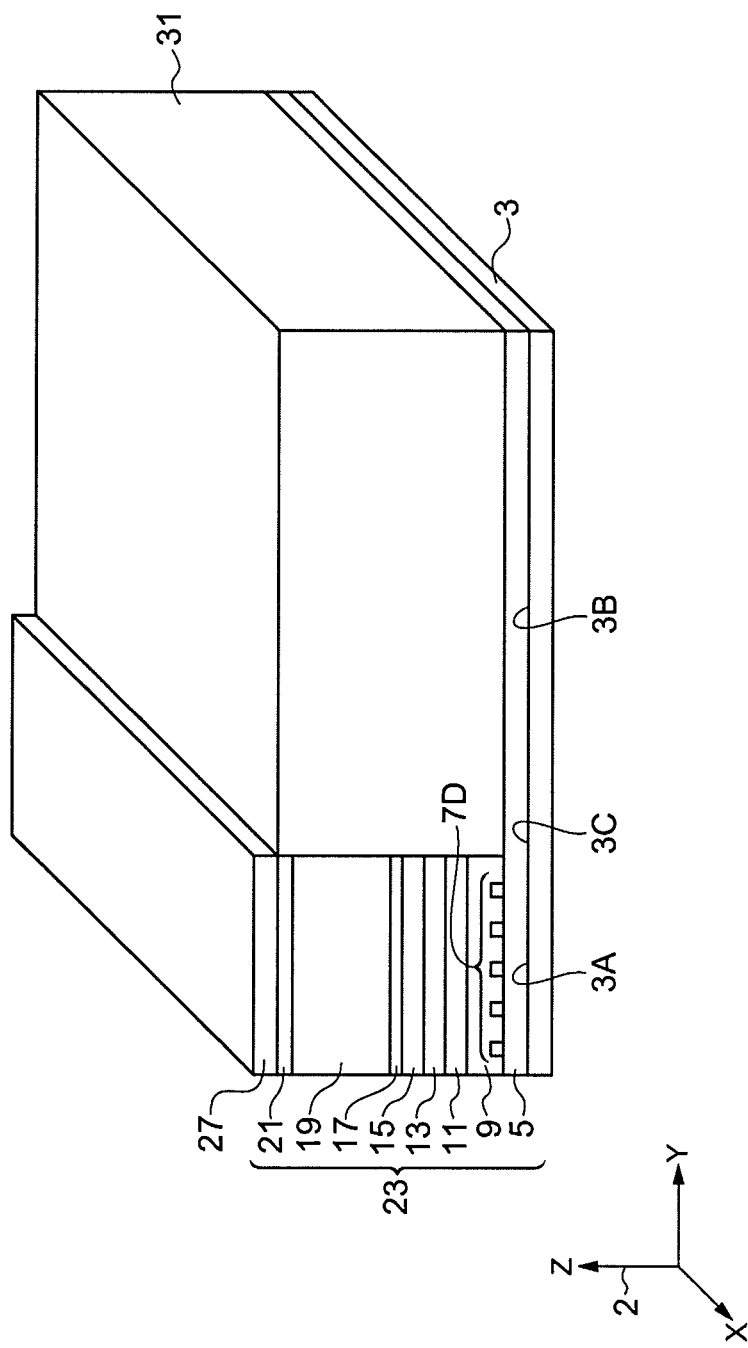
FIG. 9 is yet another perspective view illustrating the method of manufacturing a ridge-type semiconductor laser.

The other regions of the diffraction grating layer 7 residing above the second surface 3B and the third surface 3C are removed in a later step (see FIG. 8). Therefore, together with the region of the diffraction grating layer 7 residing above the first surface 3A, the region of the diffraction grating layer 7 residing above the second surface 3B and/or the region of the diffraction grating layer 7 residing above the third surface 3C may also be patterned the same as the diffraction grating 7D in this step.

Figure 6:
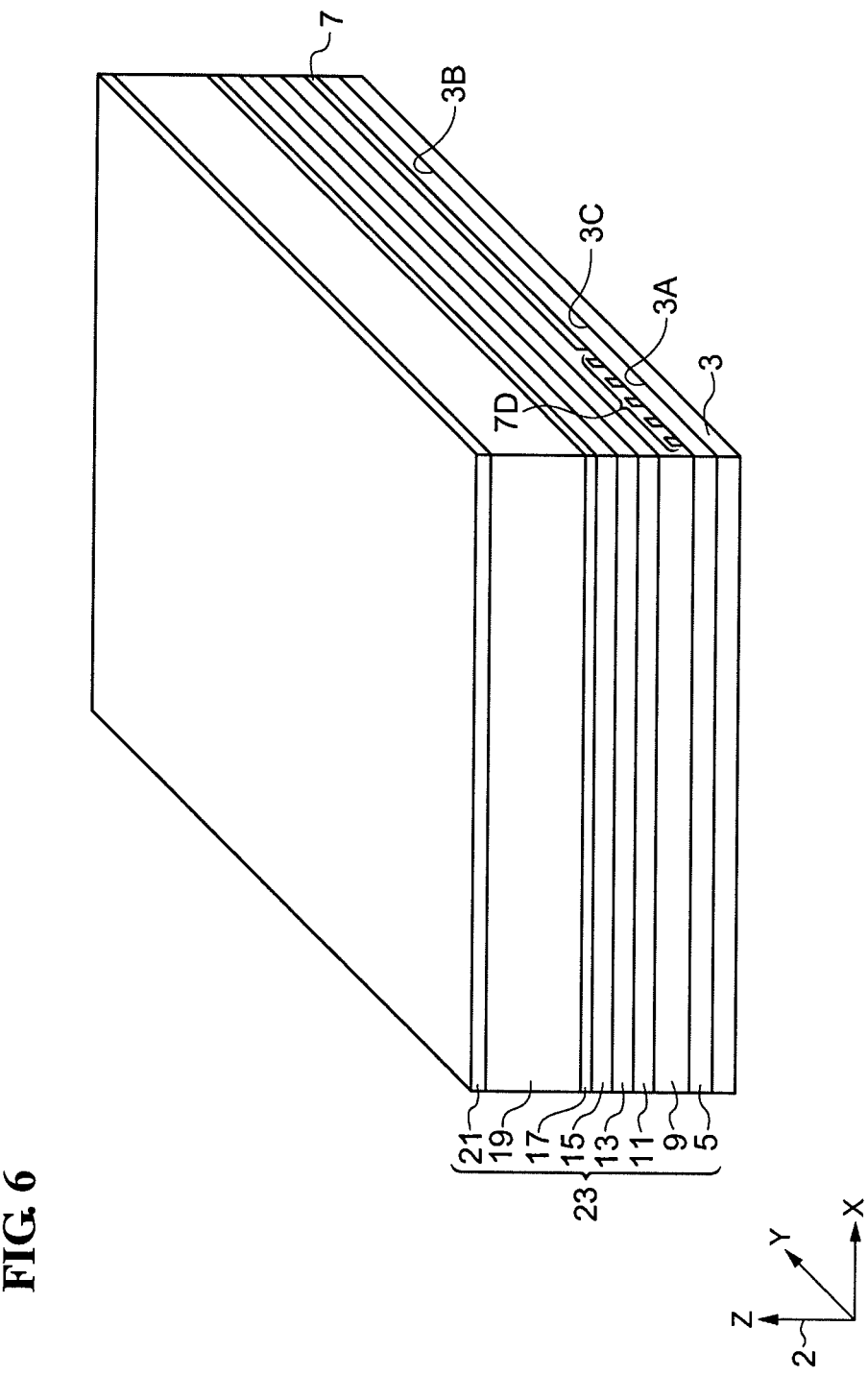
FIG. 6 is yet another perspective view illustrating the method of manufacturing a ridge-type semiconductor laser.

Subsequently, referring to FIG. 6, a filling layer 9, a lower light-confining layer 11, an active layer 13, an upper light-confining layer 15, an etch stop layer 17, an upper cladding layer 19, and a contact layer 21 are formed in that order on the diffraction grating 7D and the remaining diffraction grating layer 7 by, for example, an epitaxial growth method such as a MOVPE method. Thus, a stacked semiconductor layer 23 is formed on the first surface 3A, the second surface 3B, and the third surface 3C.

The filling layer 9 is, for example, a first-conducting-type semiconductor layer made of a III-V group compound semiconductor such as InP. The filling layer 9 on the diffraction grating 7D fills the recesses of the diffraction grating 7D and has a flat surface. The diffraction grating 7D and the filling layer 9 filling the recesses of the diffraction grating 7D in combination form a diffraction grating structure of a distributed feedback laser (DFB LD). The diffraction grating structure has a refractive index that varies periodically in the Y-axis direction. The diffraction grating structure reflects light having a wavelength (Bragg wavelength) of, for example, 1300 nm, which is defined by the period of the diffraction grating 7D. The lower light-confining layer 11 is, for example, a first-conducting-type semiconductor layer made of a III-V group compound semiconductor such as AlGaInAs. The active layer 13 has, for example, a multi quantum well (MQW) structure or a single quantum well (SQW) structure and is made of a III-V group compound semiconductor such as non-doped AlGaInAs. If the active layer 13 has a MQW structure, the active layer 13 includes, for example, a well layer having a thickness of 6 nm and a bandgap wavelength of 1.4 μm and a barrier layer having a thickness of 9 nm and a bandgap wavelength of 1.10 μm. In this case, photoluminescence (PL) with a peak wavelength of about 1310 nm is emitted from the MQW structure at room temperature (RT). The upper light-confining layer 15 is made of, for example, a III-V group compound semiconductor such as non-doped AlGaInAs.

The etch stop layer 17 is made of a semiconductor material having a smaller etching rate, in the second stacked-semiconductor-layer-etching step S7-3 to be performed later (see FIGS. 15 and 16), than the semiconductor layers made of InP and the like. The etch stop layer 17 is preferably made of an aluminum (Al)-containing semiconductor material, for example, an Al-containing III-V group compound semiconductor such as AlInAs, AlInAsP, or AlGaInAs. In the present embodiment, the etch stop layer 17 made of the foregoing material functions as a large potential barrier for electrons in the conduction band. Hence, the etch stop layer 17 also functions as a carrier stop layer for electrons. The etch stop layer 17 is made of a p-type semiconductor material.

The upper cladding layer 19 is of a second conducting type (for example, p-type) and is made of, for example, a III-V group compound semiconductor such as InP. The contact layer 21 is of a second conducting type (for example, p-type) and is made of, for example, a III-V group compound semiconductor such as GaInAs.

Thus, in the stacked-semiconductor-layer-forming step S1, the stacked semiconductor layer 23 including the active layer 13 and the etch stop layer 17 provided on the active layer 13 is formed on the first surface 3A, the second surface 3B, and the third surface 3C. The stacked semiconductor layer 23 has a configuration for forming a semiconductor laser.

First Stacked-Semiconductor-Layer-Etching Step S3

Subsequently, the first stacked-semiconductor-layer-etching step S3 is performed. In this step, a region of the stacked semiconductor layer 23 formed on the second surface 3B and the third surface 3C is etched off. Specifically, referring to FIG. 7, a butt-joint mask 27 is formed. The butt-joint mask 27 has a pattern that covers a region of the stacked semiconductor layer 23 formed on the first surface 3A but does not cover the other region of the stacked semiconductor layer 23 formed on the second surface 3B and the third surface 3C. The butt-joint mask 27 is, for example, a dielectric film made of silicon nitride (SiN), silicon dioxide ($SiO_2$), or the like. As an exemplary method of forming the butt-joint mask 27, a dielectric film made of SiN or the like is formed on the entire surface of the stacked semiconductor layer 23 by a chemical vapor deposition (CVD) method or the like. Furthermore, a resist layer is formed on the dielectric film. Subsequently, the resist layer is photolithographically patterned such that a region thereof residing above the first surface 3A remains but the other region thereof residing over the second surface 3B and the third surface 3C is removed. Subsequently, the dielectric film is wet-etched by using the patterned resist layer as a mask and with buffered hydrofluoric acid (BHF) or the like, whereby the butt-joint mask 27 is provided.

In the present embodiment, the formation of the butt-joint mask 27 in the first stacked-semiconductor-layer-etching step S3 is also regarded as the first-mask-portion-patterning step S7-1 included in the ridge-waveguide-portion-forming step S7 to be performed later (see FIG. 10). That is, the butt-joint mask 27 also functions as a first mask portion according to the present embodiment.

Subsequently, referring to FIG. 8, the region of the stacked semiconductor layer 23 formed on the second surface 3B and the third surface 3C is etched off by using the butt-joint mask 27 as an etching mask and by, for example, a wet etching method using sulfuric acid ($H_2SO_4$), hydrogen bromide (HBr), hydrogen chloride (HCl), or the like. This etching is performed such that at least a portion of the etch stop layer 17 and a portion of the active layer 13 in the region of the stacked semiconductor layer 23 formed on the second surface 3B and the third surface 3C are removed. In the present embodiment, the etching is performed such that a portion of the lower cladding layer 5 in the region of the stacked semiconductor layer 23 formed on the second surface 3B and the third surface 3C remains. Alternatively, all layers in the region of the stacked semiconductor layer 23 formed on the second surface 3B and the third surface 3C may be removed.

Semiconductor-Portion-Forming Step S5

Subsequently, the semiconductor-portion-forming step S5 is performed. In this step, referring to FIG. 9, a semiconductor portion 31 is formed on the second surface 3B and the third surface 3C. That is, the semiconductor portion 31 is formed on an area where the stacked semiconductor layer 23 has been etched off in the first stacked-semiconductor-layer-etching step S3. The semiconductor portion 31 is to be processed in a later step into a plurality of semiconductor diffraction grating portions 31A and the optical waveguide portion 31B (see FIGS. 14 and 15). The bandgap energy of the semiconductor portion 31 is larger than that of the active layer 13. The semiconductor portion 31 is made of a semiconductor material that is different from the material of the etch stop layer 17. For example, the semiconductor portion 31 is made of a III-V group compound semiconductor such as non-doped InP. The semiconductor portion 31 may be formed on the second surface 3B and the third surface 3C by an epitaxial growth method such as a MOVPE method with the butt-joint mask 27 as a selective growth mask.

Ridge-Waveguide-Portion-Forming Step S7, Semiconductor-Diffraction-Grating-Portion-Forming Step S9, and Optical-Waveguide-Portion-Forming Step S11

Subsequently, the ridge-waveguide-portion-forming step S7, the semiconductor-diffraction-grating-portion-forming step S9, and the optical-waveguide-portion-forming step S11 are performed. In the ridge-waveguide-portion-forming step S7, the region of the stacked semiconductor layer 23 formed on the first surface 3A is etched, whereby a ridge waveguide portion 55 is provided. In the semiconductor-diffraction-grating-portion-forming step S9, a region of the semiconductor portion 31 formed on the second surface 3B is etched, whereby the semiconductor diffraction grating portions 31A are provided. In the optical-waveguide-portion-forming step S11, the other region of the semiconductor portion 31 formed on the third surface 3C is etched, whereby the optical waveguide portion 31B is provided.

The ridge-waveguide-portion-forming step S7 includes the first-mask-portion-patterning step S7-1 and the second stacked-semiconductor-layer-etching step S7-3. The semiconductor-diffraction-grating-portion-forming step S9 includes the second-mask-portion-patterning step S9-1 and the first semiconductor-portion-etching step S9-3. The optical-waveguide-portion-forming step S11 includes the third-mask-portion-patterning step S11-1 and the second semiconductor-portion-etching step S11-3.

First-Mask-Portion-Patterning Step S7-1, Second-Mask-Portion-Patterning Step S9-1, and Third-Mask-Portion-Patterning Step S11-1

Figure 7:
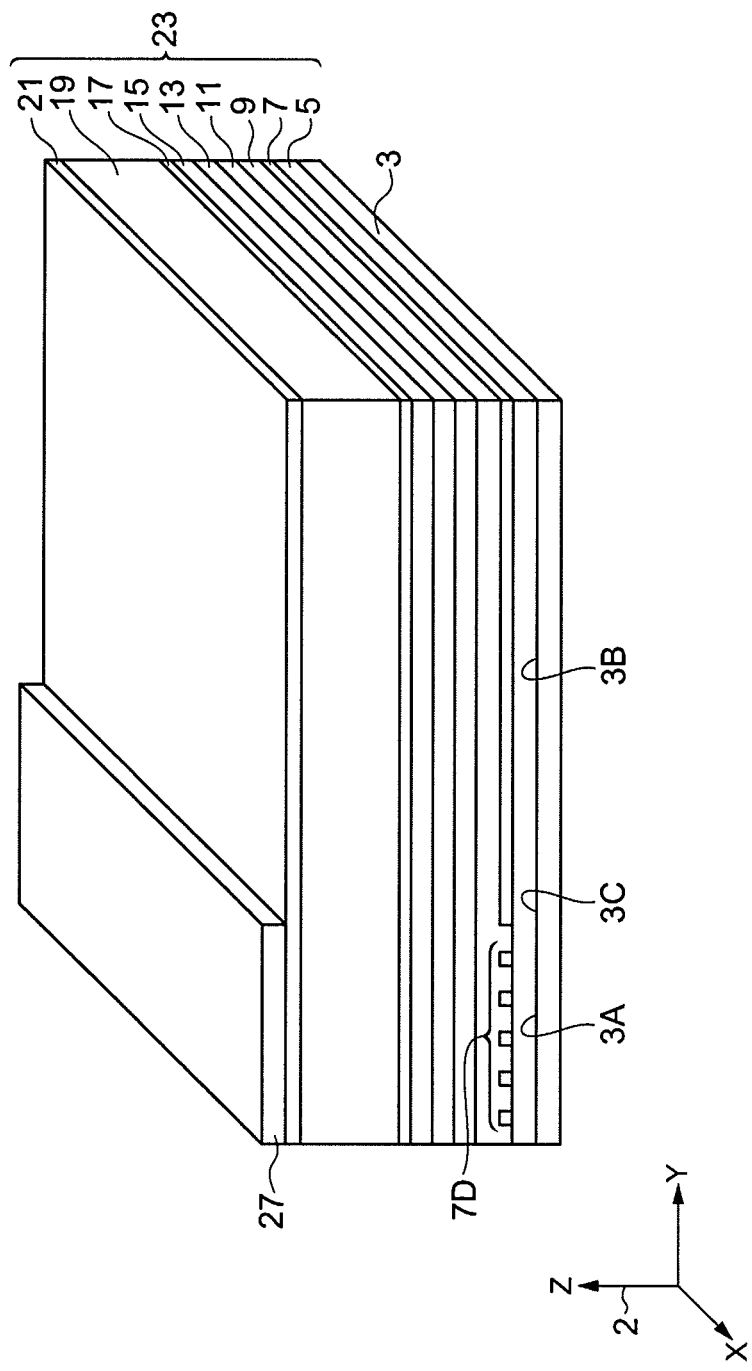
FIG. 7 is yet another perspective view illustrating the method of manufacturing a ridge-type semiconductor laser.

As described above, in the present embodiment, the formation of the butt-joint mask 27 performed in the first stacked-semiconductor-layer-etching step S3 is also regarded as the formation of a first mask portion (see FIG. 7). Therefore, referring to FIG. 10 and FIG. 11, the butt-joint mask 27 also functions as a first mask portion 27 that is formed at the beginning of the first-mask-portion-patterning step S7-1 according to the present embodiment. Here, FIG. 11 illustrates a section taken along line XI-XI illustrated in FIG. 10. Alternatively, after the first stacked-semiconductor-layer-etching step S3, the butt-joint mask 27 may be removed and a first mask portion made of the same material as the butt-joint mask 27 may be formed on the stacked semiconductor layer 23.

Figure 10:
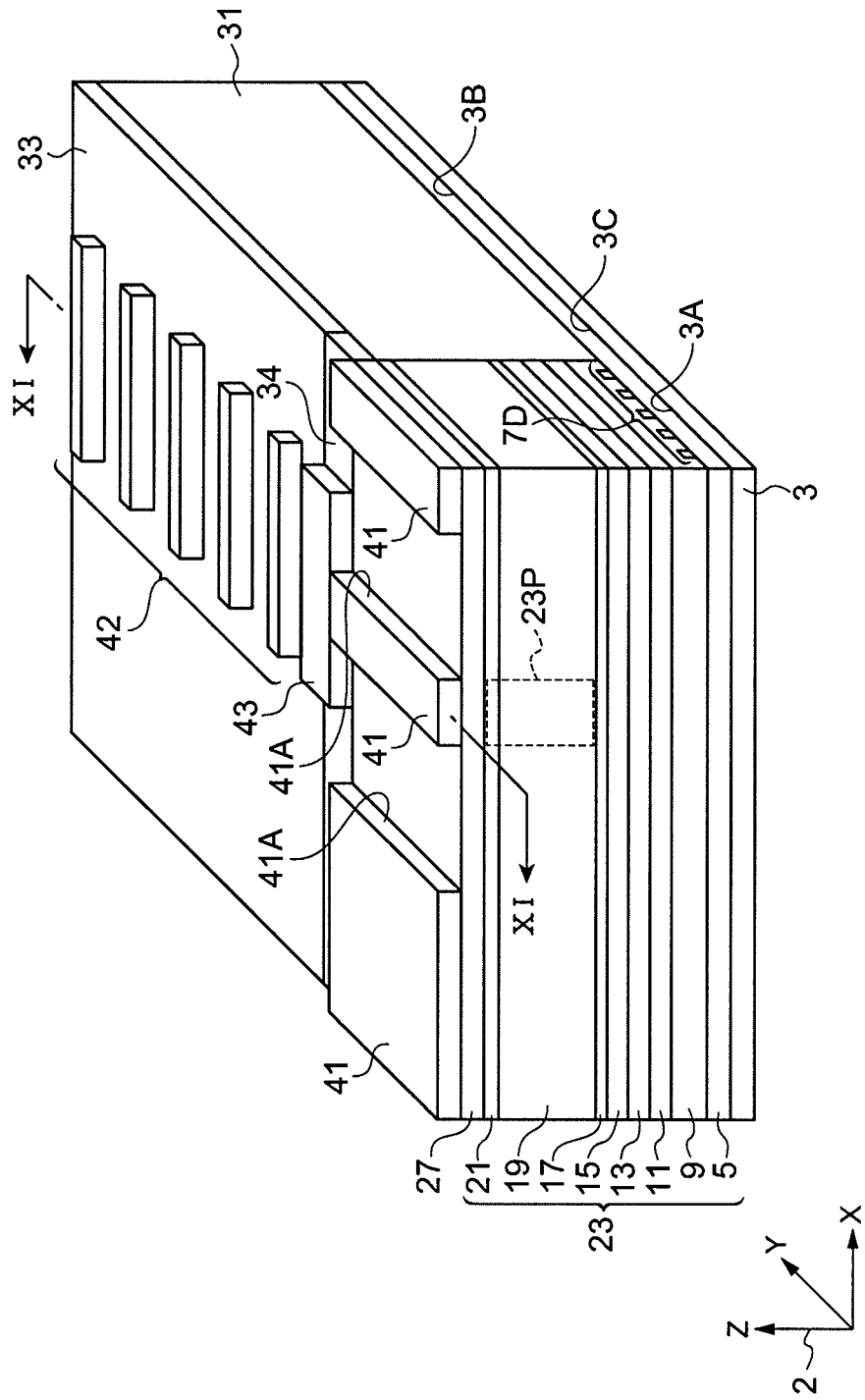
FIG. 10 is yet another perspective view illustrating the method of manufacturing a ridge-type semiconductor laser.
Figure 11:
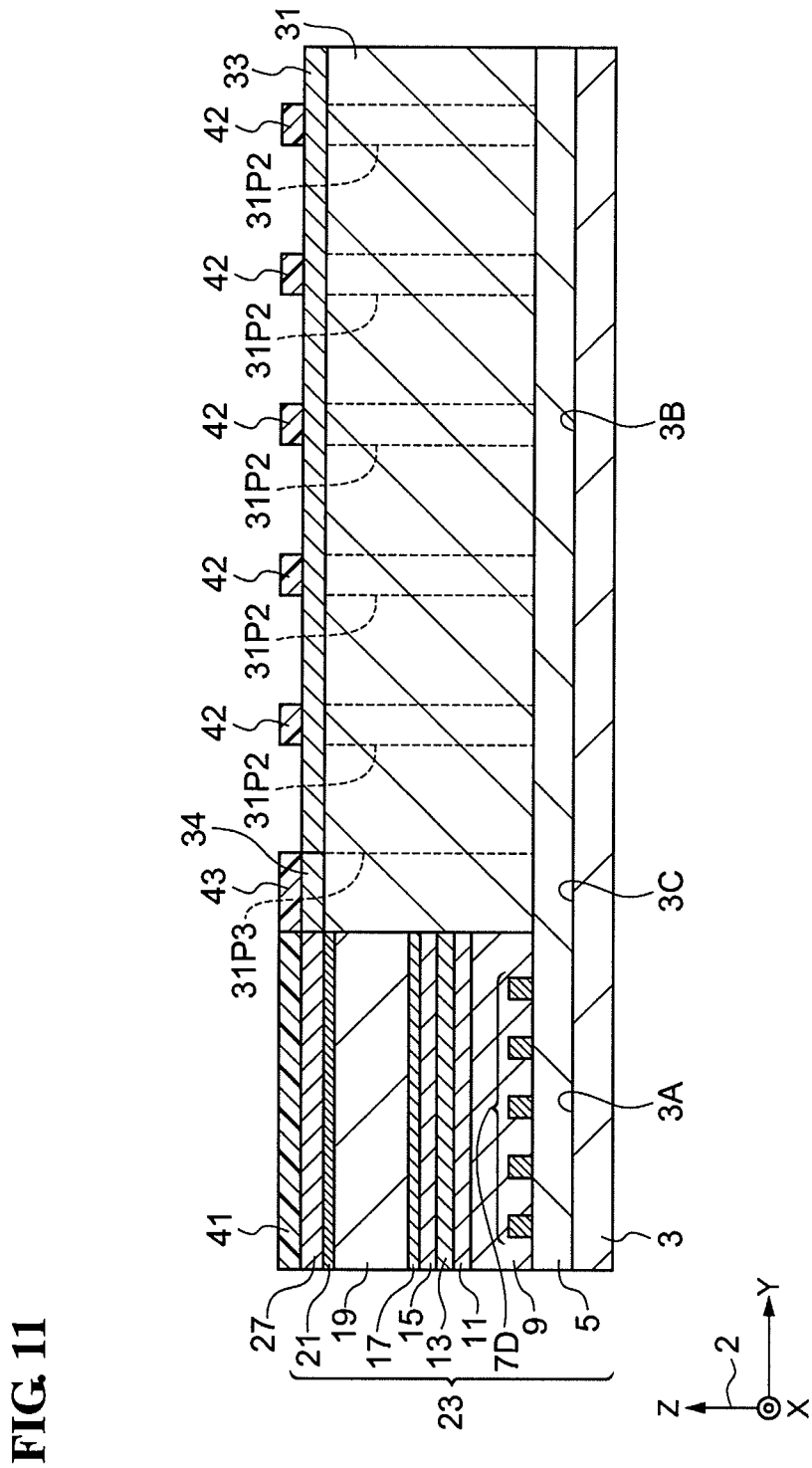
FIG. 11 is a sectional view illustrating the method of manufacturing a ridge-type semiconductor laser.

At the beginning of the second-mask-portion-patterning step S9-1 and the third-mask-portion-patterning step S11-1, as illustrated in FIGS. 10 and 11, a second mask portion 33 and a third mask portion 34 are formed, respectively, on the semiconductor portion 31 by a CVD method or the like. The first mask portion 27, the third mask portion 34, and the second mask portion 33 are provided in that order in the Y-axis direction on the stacked semiconductor layer 23 and the semiconductor portion 31. That is, the third mask portion 34 resides between the first mask portion 27 and the second mask portion 33. In the present embodiment, the second mask portion 33 and the third mask portion 34 are formed as one body. The second mask portion 33 and the third mask portion 34 are formed as, for example, a dielectric film made of SiN, $SiO_2$, or the like and extend over the entire surface of the semiconductor portion 31.

In the first-mask-portion-patterning step S7-1, the first mask portion 27 formed as described above is patterned. In the second-mask-portion-patterning step S9-1, the second mask portion 33 formed as described above is patterned. In the third-mask-portion-patterning step S11-1, the third mask portion 34 formed as described above is patterned. The first-mask-portion-patterning step S7-1, the second-mask-portion-patterning step S9-1, and the third-mask-portion-patterning step S11-1 are performed simultaneously by pattern transfer from one master pattern.

Specifically, a photoresist layer (resin layer) for lithography is first formed on the entire surfaces of the first mask portion 27, the second mask portion 33, and the third mask portion 34. If this pattern formation process is performed by a nano-imprint lithography method, a resin layer for nano-imprint lithography is formed on the entire surfaces of the first mask portion 27, the second mask portion 33, and the third mask portion 34. Subsequently, the resin layer is patterned by transferring respective patterns from one master pattern by a lithography method, a nano-imprint lithography method, or the like. Thus, as illustrated in FIGS. 10 and 11, a first resin layer 41, a second resin layer 42 and a third resin layer 43 are provided simultaneously.

Figure 12:
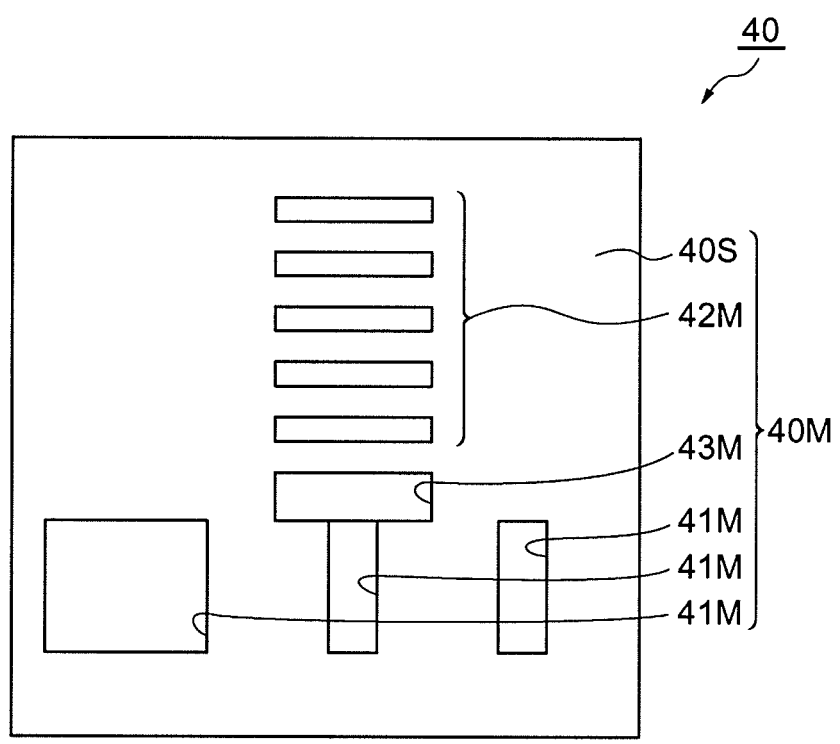
FIG. 12 is a plan view illustrating a mold for nano-imprint lithography.

The above simultaneous formation process of the first resin layer 41, the second resin layer 42, and the third resin layer 43 from one resin layer will be described more specifically. When the first-mask-portion-patterning step S7-1, the second-mask-portion-patterning step S9-1, and the third-mask-portion-patterning step S11-1 are performed by nano-imprint lithography method, a mold 40 for nano-imprint lithography illustrated in FIG. 12 is prepared. The mold 40 includes a substantially flat mold surface 40S, recesses 41M, recesses 42M, and a recess 43M. The shapes of the recesses 41M, the recesses 42M, and the recess 43M correspond to the shapes of the first resin layer 41, the second resin layer 42, and the third resin layer 43, respectively. The mold surface 40S, the recesses 41M, the recesses 42M, and the recess 43M in combination form a master pattern 40M.

After the mold 40 is prepared, a resin layer made of a photo-curable resin, a thermo-curable resin, or the like for nano-imprint lithography is formed on the entire surfaces of the first mask portion 27, the second mask portion 33, and the third mask portion 34. Subsequently, the mold 40 having the master pattern 40M is pressed into the resin layer, and the resin layer is cured while maintaining the contact between the resin layer and the master pattern 40M of the mold 40. Subsequently, the mold 40 is detached from the cured resin layer. Thus, the resin layer is given patterns transferred from the master pattern 40M, whereby the first resin layer 41, the second resin layer 42, and the third resin layer 43 are provided simultaneously.

The first resin layer 41 is a resin layer patterned in a predetermined shape on the first mask portion 27 in such a manner as to correspond to the ridge waveguide portion 55 to be formed in a later step (see FIG. 15). As illustrated in FIG. 10, the first resin layer 41 patterned as described above includes a segment extending in the Y-axis direction and covering a region 23P of the stacked semiconductor layer 23 that is to become the ridge waveguide portion 55. In addition, the first resin layer 41 has a pair of openings 41A provided in regions thereof on both sides, in the X-axis direction, of the region 23P of the stacked semiconductor layer 23 that is to become the ridge waveguide portion 55.

The second resin layer 42 is a resin layer patterned in a predetermined shape on an area of the second mask portion 33 in such a manner as to correspond to the semiconductor diffraction grating portions 31A to be formed in a later step (see FIGS. 15 and 16). As illustrated in FIG. 11, the second resin layer 42 patterned as described above includes segments each extending in the X-axis direction and covering a corresponding one of regions 31P2 of the semiconductor portion 31 that are to become the semiconductor diffraction grating portions 31A. The other regions of the semiconductor portion 31 are not covered with the second resin layer 42.

The third resin layer 43 is a resin layer patterned in a predetermined shape on an area of the third mask portion 34 in such a manner as to correspond to the optical waveguide portion 31B to be formed in a later step (see FIGS. 15 and 16). As illustrated in FIG. 11, the third resin layer 43 patterned as described above includes a segment extending in the X-axis direction and covering a region 31P3 of the semiconductor portion 31 that is to become the optical waveguide portion 31B. The other regions of the semiconductor portion 31 are not covered with the third resin layer 43.

Figure 13:
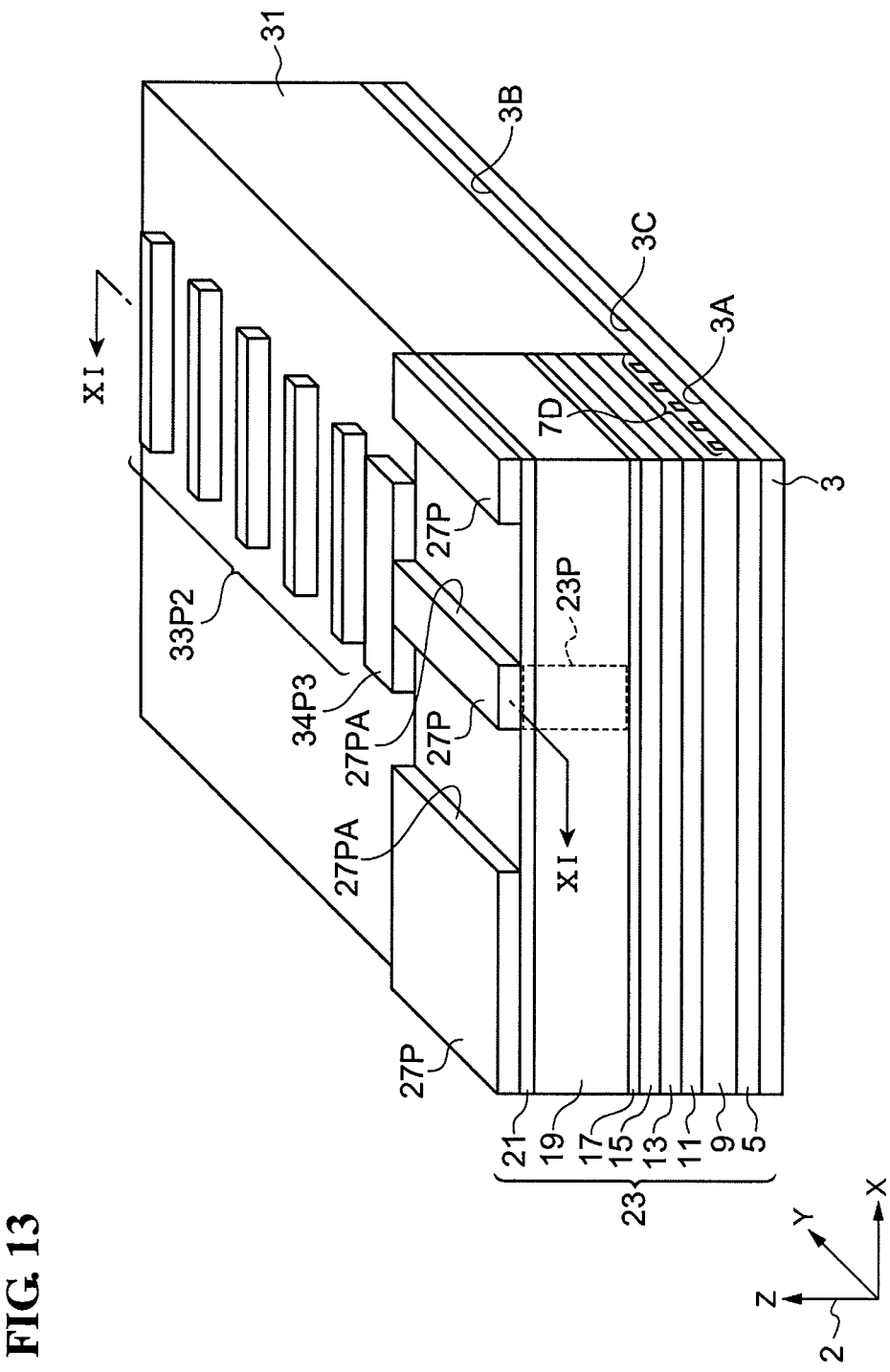
FIG. 13 is yet another perspective view illustrating the method of manufacturing a ridge-type semiconductor laser.
Figure 14:
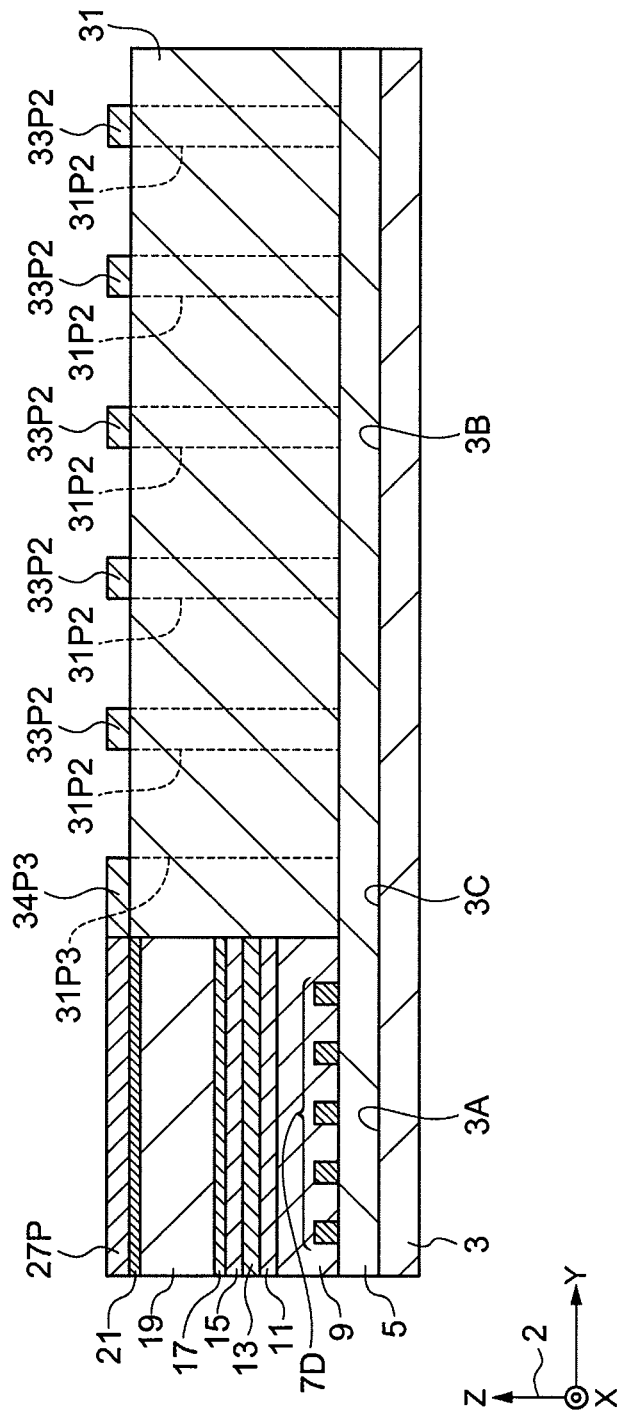
FIG. 14 is another sectional view illustrating the method of manufacturing a ridge-type semiconductor laser.

After the first resin layer 41, the second resin layer 42, and the third resin layer 43 are formed as described above, the first mask portion 27, the second mask portion 33, and the third mask portion 34 are etched by using the first resin layer 41, the second resin layer 42, and the third resin layer 43 as an etching masks. The first mask portion 27, the second mask portion 33, and the third mask portion 34 are etched by, for example, a reactive ion etching (RIE) method with carbon tetrafluoride ($CF_4$) as an etching gas. Subsequently, the first resin layer 41, the second resin layer 42, and the third resin layer 43 are removed. Thus, the pattern of the first resin layer 41 is transferred to the first mask portion 27. The pattern of the second resin layer 42 is transferred to the second mask portion 33. And the pattern of the third resin layer 43 is transferred to the third mask portion 34. Consequently, as illustrated in FIG. 13 and FIG. 14, a patterned first mask portion 27P, a patterned second mask portion 33P2, and a patterned third mask portion 34P3 are provided. Here, FIG. 14 illustrates a section taken along line XIV-XIV illustrated in FIG. 13.

The patterned first mask portion 27P has a shape corresponding to the ridge waveguide portion 55 to be formed in a later step (see FIG. 15). As illustrated in FIG. 13, the patterned first mask portion 27P includes a segment extending in the Y-axis direction and covering the region 23P of the stacked semiconductor layer 23 that is to become the ridge waveguide portion 55. The patterned first mask portion 27P also has a pair of openings 27PA provided in regions thereof on both sides, in the X-axis direction, of the region 23P of the stacked semiconductor layer 23 that is to become the ridge waveguide portion 55.

The patterned second mask portion 33P2 has a shape corresponding to the semiconductor diffraction grating portions 31A to be formed in a later step (see FIGS. 15 and 16). As illustrated in FIGS. 13 and 14, the patterned second mask portion 33P2 includes segments each extending in the X-axis direction and covering a corresponding one of the regions 31P2 of the semiconductor portion 31 that are to become the semiconductor diffraction grating portions 31A. The other regions of the semiconductor portion 31 are not covered with the patterned second mask portion 33P2.

The patterned third mask portion 34P3 has a shape corresponding to the optical waveguide portion 31B to be formed in a later step (see FIGS. 15 and 16). As illustrated in FIGS. 13 and 14, the patterned third mask portion 34P3 includes a segment extending in the X-axis direction and covering the region 31P3 of the semiconductor portion 31 that is to become the optical waveguide portion 31B. The other regions of the semiconductor portion 31 are not covered with the patterned third mask portion 34P3.

Thus, the first mask portion 27, the second mask portion 33, and the third mask portion 34 are simultaneously patterned by pattern transfer from the master pattern 40M.

Second Stacked-Semiconductor-Layer-Etching Step S7-3, First Semiconductor-Portion-Etching Step S9-3, and Second Semiconductor-Portion-Etching Step S11-3

In the second stacked-semiconductor-layer-etching step S7-3, the stacked semiconductor layer 23 is etched, whereby the ridge waveguide portion 55 is provided. In the first semiconductor-portion-etching step S9-3, the semiconductor portion 31 is etched, whereby the plurality of semiconductor diffraction grating portions 31A are provided below the second mask portion 33. In the second semiconductor-portion-etching step S11-3, the semiconductor portion 31 is etched, whereby the optical waveguide portion 31B is provided below the third mask portion 34.

Figure 15:
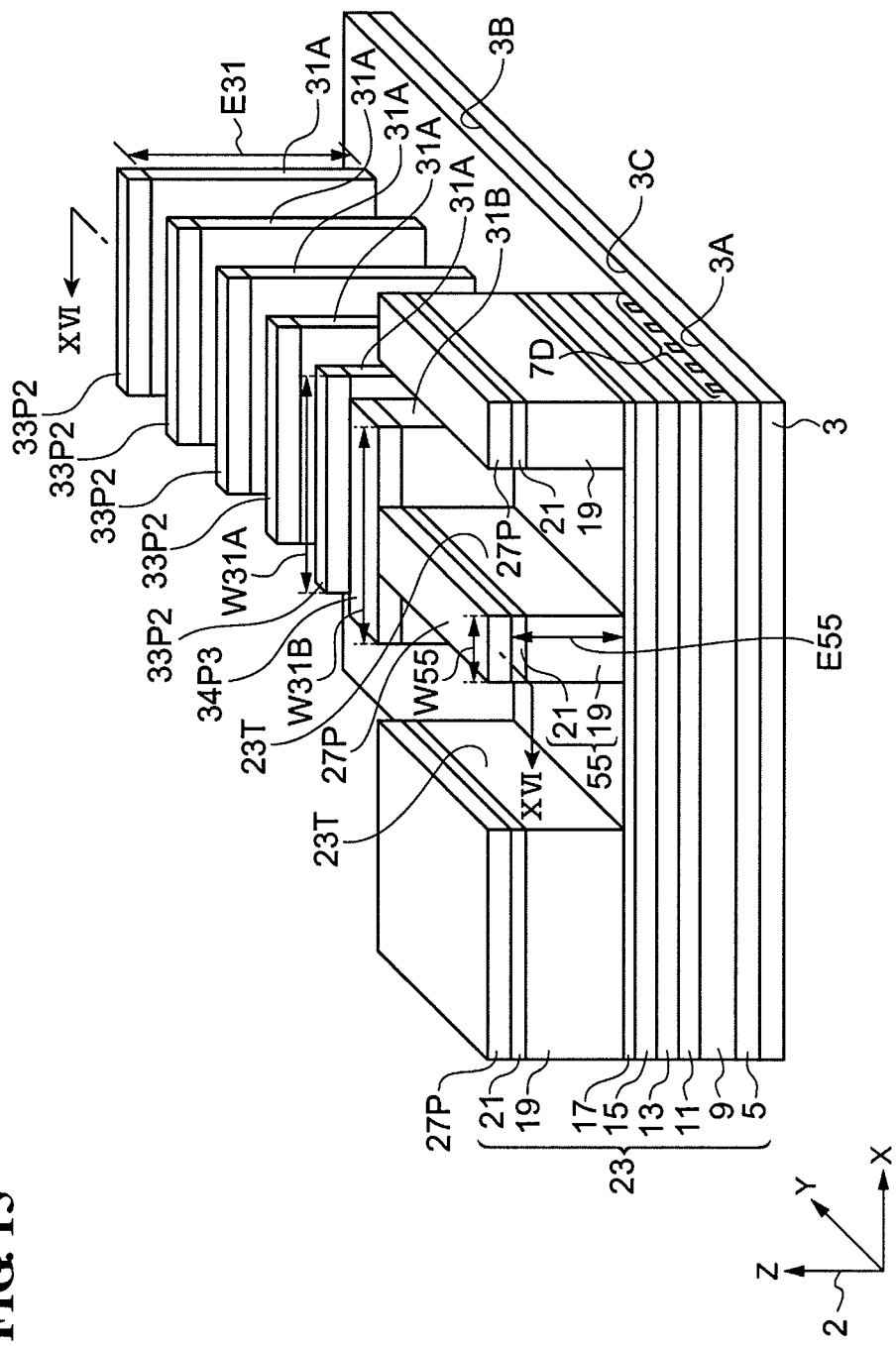
FIG. 15 is yet another perspective view illustrating the method of manufacturing a ridge-type semiconductor laser.
Figure 16:
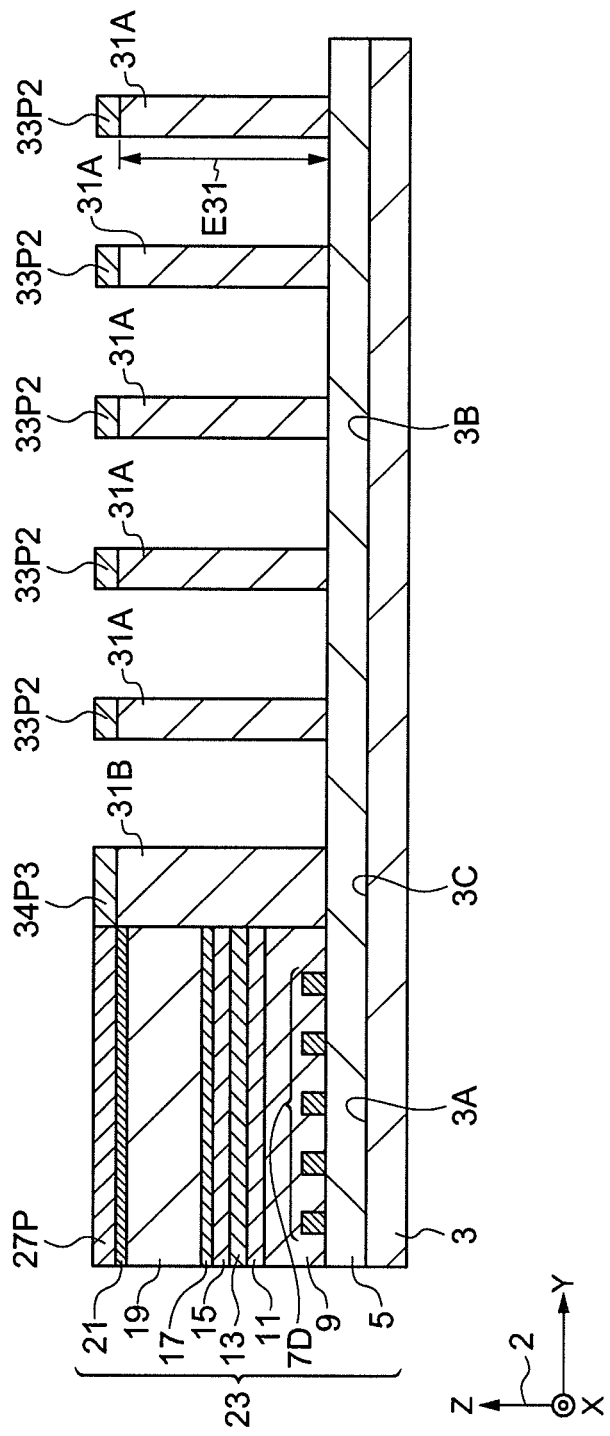
FIG. 16 is yet another sectional view illustrating the method of manufacturing a ridge-type semiconductor laser.

Specifically, referring to FIG. 16, the stacked semiconductor layer 23 masked with the patterned first mask portion 27P, the region of the semiconductor portion 31 masked with the patterned second mask portion 33P2, and the region of the semiconductor portion 31 masked with the patterned third mask portion 34P3 are etched simultaneously. FIG. 16 is a sectional view taken along line XVI-XVI illustrated in FIG. 15. An experiment shows that, if this etching is performed by a RIE method using a gas mixture of methane ($CH_4$) gas and hydrogen ($H_2$) gas, the etching rate of an Al-containing III-V group compound semiconductor is smaller than that of a non-Al-containing III-V group compound semiconductor (such as InP, GaInAsP, or the like). Hence, if the stacked semiconductor layer 23 and the semiconductor portion 31 are simultaneously etched on condition that the etch stop layer 17 is made of an Al-containing III-V group compound semiconductor and the semiconductor portion 31 is made of InP or the like, the etch stop layer 17 functions effectively. As an exemplary RIE method, an inductively coupled plasma (ICP) reactive ion etching (RIE) method may be employed.

The ratio of the etching rate of the semiconductor portion 31 to the etching rate of the etch stop layer 17 is adjustable by changing parameters including the kind of the RIE method, the mixing ratio of $CH_4$ gas and $H_2$ gas, the etching pressure, the bias power density, and so forth. If an ICP-RIE method is employed, the ratio of etching rates (etching selectivity) of the above semiconductor layers are adjustable by changing the ICP power density, in addition to the above parameters.

As an example, an etch stop layer 17 made of AlInAs and a semiconductor portion 31 made of InP were etched by an ICP-RIE method at a mixing ratio of $CH_4$ gas and $H_2$ gas of 1:3, at an etching pressure of 2 Pa, with a bias power density of 0.3 W/cm$^2$, and with an ICP power density of 4.4 W/cm$^2$. In this example, the etching rate of the etch stop layer 17 was about 40% of that of the semiconductor portion 31.

In the above etching step, the semiconductor portion 31 is etched deeper than the stacked semiconductor layer 23, which includes the etch stop layer 17. Specifically, the stacked semiconductor layer 23 is etched to a first depth E55 reaching the etch stop layer 17. Meanwhile, the semiconductor portion 31 is etched to a second depth E31 larger than the first depth E55.

Thus, a ridge waveguide portion 55 having a height corresponding to the first depth E55 is provided below the patterned first mask portion 27P. The ridge waveguide portion 55 is provided at a higher level than the active layer 13. Furthermore, a plurality of semiconductor diffraction grating portions 31A each having a height corresponding to the second depth E31 are provided below the patterned second mask portion 33P2. Furthermore, an optical waveguide portion 31B having a height corresponding to the second depth E31 is provided below the patterned third mask portion 34P3. In the present embodiment, the ridge waveguide portion 55, the semiconductor diffraction grating portions 31A, and the optical waveguide portion 31B are formed simultaneously. The first depth E55 is, for example, 2.0 μm. The second depth E31 is, for example, 2.3 μm.

The ridge waveguide portion 55 projects in a direction intersecting the major surface 3S of the semiconductor substrate 3 (in the present embodiment, in the Z-axis direction orthogonal to the major surface 3S) and extends in the Y-axis direction. The direction in which the ridge waveguide portion 55 extends corresponds to a waveguiding direction of the ridge-type semiconductor laser portion LD that is to be complete later (see FIGS. 23 and 24). In addition, a pair of stripe grooves 23T each extending in the Y-axis direction are provided on both sides of the ridge waveguide portion 55 in the X-axis direction.

Figure 23:
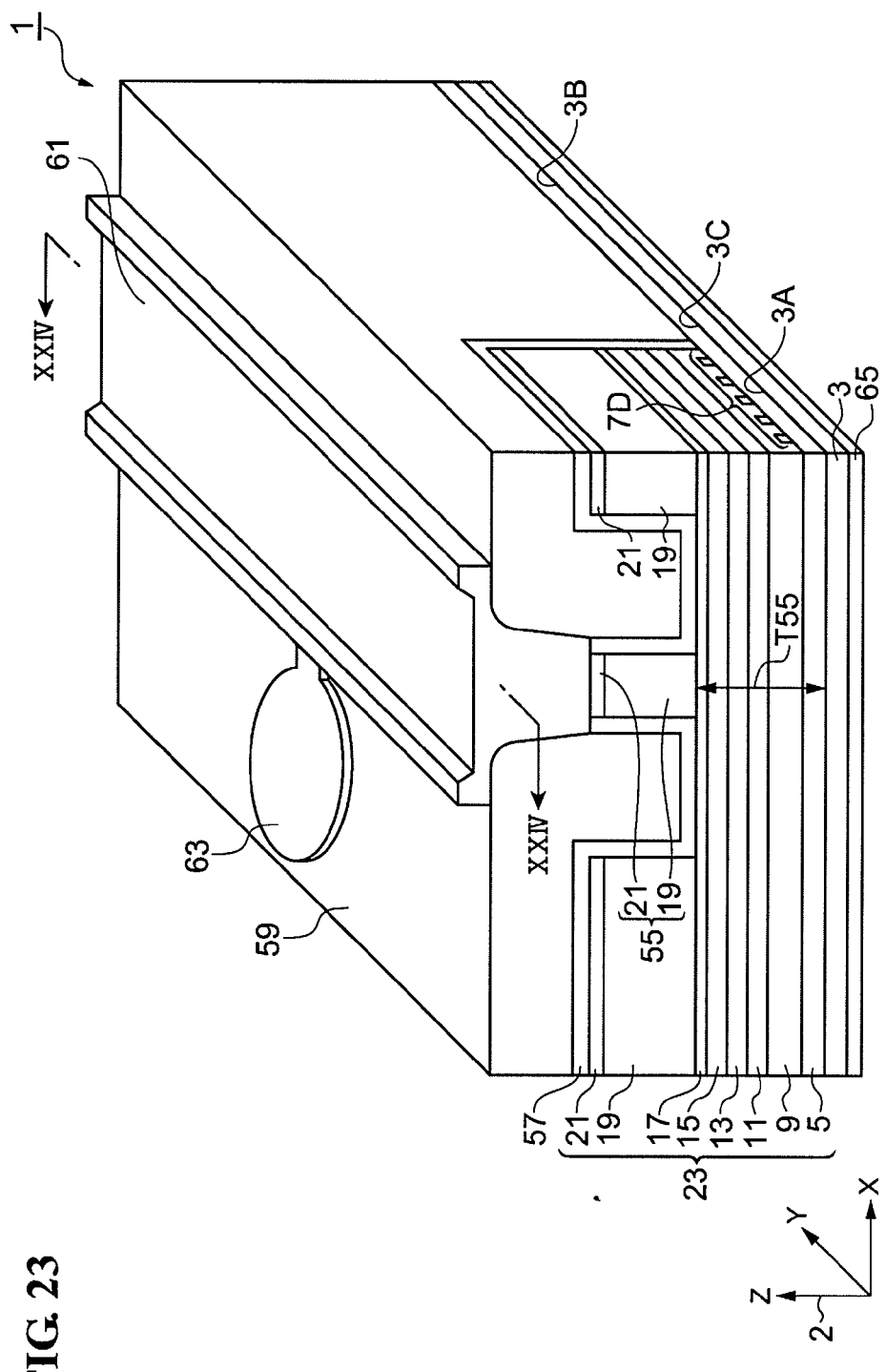
FIG. 23 is yet another perspective view illustrating the method of manufacturing a ridge-type semiconductor laser.
Figure 24:
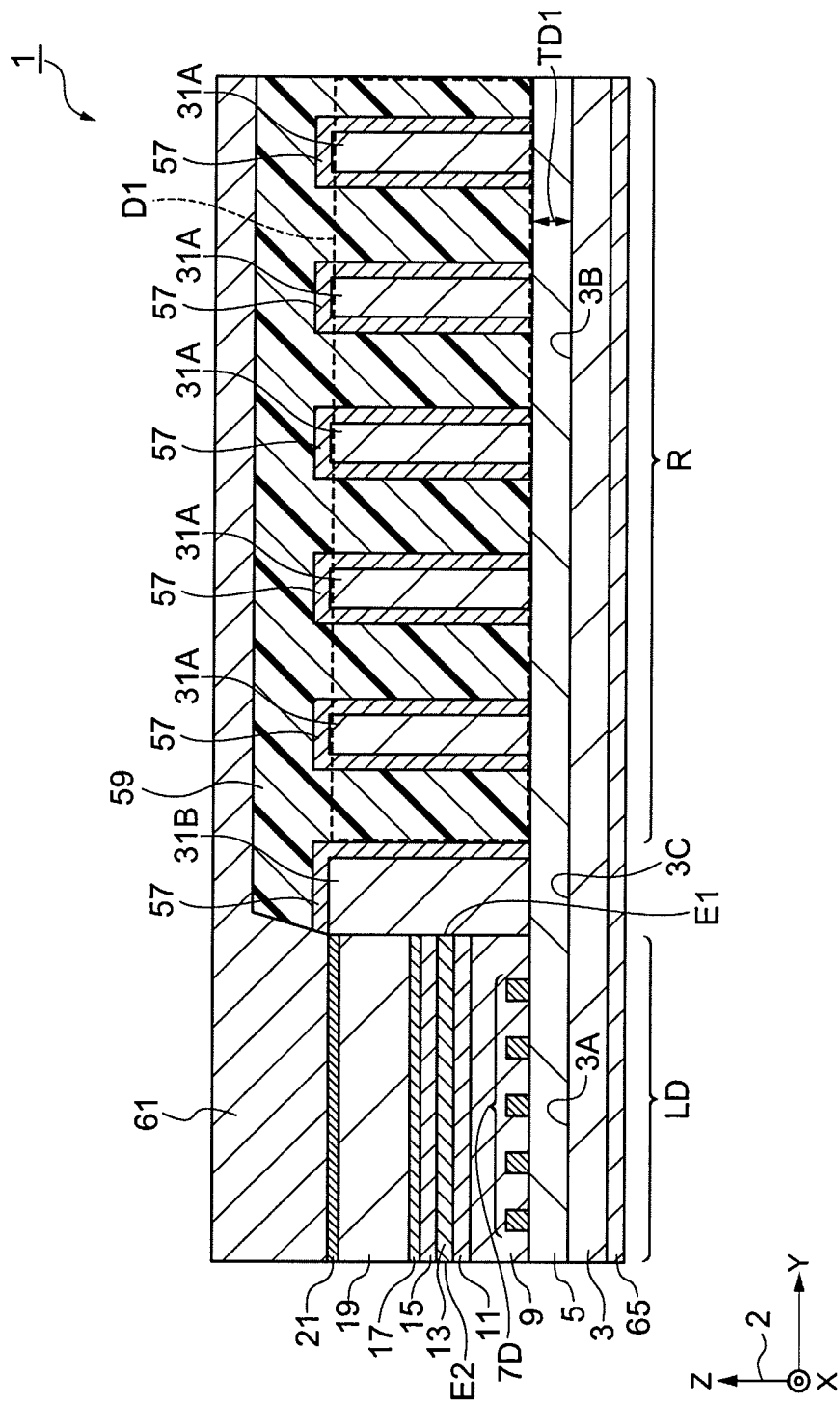
FIG. 24 is yet another sectional view illustrating the method of manufacturing a ridge-type semiconductor laser.

The plurality of semiconductor diffraction grating portions 31A each project in the direction intersecting the major surface 3S of the semiconductor substrate 3 (in the present embodiment, in the Z-axis direction orthogonal to the major surface 3S) and are provided periodically in the waveguiding direction of the ridge-type semiconductor laser portion LD (in the Y-axis direction, see FIGS. 23 and 24). The bandgap energy of the semiconductor portion 31 is larger than that of the active layer 13 (see FIG. 9). Therefore, the bandgap energy of each of the plurality of semiconductor diffraction grating portions 31A is larger than that of the active layer 13. In the present embodiment, the semiconductor diffraction grating portions 31A are made of one semiconductor material and therefore each have a single-layer structure. Alternatively, the semiconductor diffraction grating portions 31A may each have a multi-layer structure including a plurality of semiconductor layers. In that case also, the semiconductor diffraction grating portions 31A each have a bandgap energy larger than that of the active layer 13.

The optical waveguide portion 31B is provided between the ridge waveguide portion 55 and the semiconductor diffraction grating portions 31A in the Y-axis direction. The bandgap energy of the semiconductor portion 31 is larger than that of the active layer 13 (see FIG. 9). Therefore, the bandgap energy of the optical waveguide portion 31B is larger than that of the active layer 13.

In the present embodiment, a length W31A of each of the plurality of semiconductor diffraction grating portions 31A and a length W31B of the optical waveguide portion 31B in the X-axis direction are larger than a length W55 of the ridge waveguide portion 55 in the X-axis direction as shown in FIG. 15. In the present embodiment, the plurality of semiconductor diffraction grating portions 31A and the optical waveguide portion 31B have substantially the same length in the X-axis direction. The lengths W31A and W31B of the plurality of semiconductor diffraction grating portions 31A and the optical waveguide portion 31B in the X-axis direction are, for example, 3.5 μm. The length W55 of the ridge waveguide portion 55 in the X-axis direction is, for example, 1.5 μm.

After the ridge waveguide portion 55, the semiconductor diffraction grating portions 31A, and the optical waveguide portion 31B are formed as described above, the patterned first mask portion 27P, the patterned second mask portion 33P2, and the patterned third mask portion 34P3 are removed by, for example, wet etching with BHF as an etchant. Thus, the ridge-waveguide-portion-forming step S7, the semiconductor-diffraction-grating-portion-forming step S9, and the optical-waveguide-portion-forming step S11 are complete.

Insulating-Layer-Forming Step S13

Subsequently, the insulating-layer-forming step S13 is performed. In this step, an insulating layer is formed on at least exposed surfaces of the semiconductor diffraction grating portions 31A.

Figure 17:
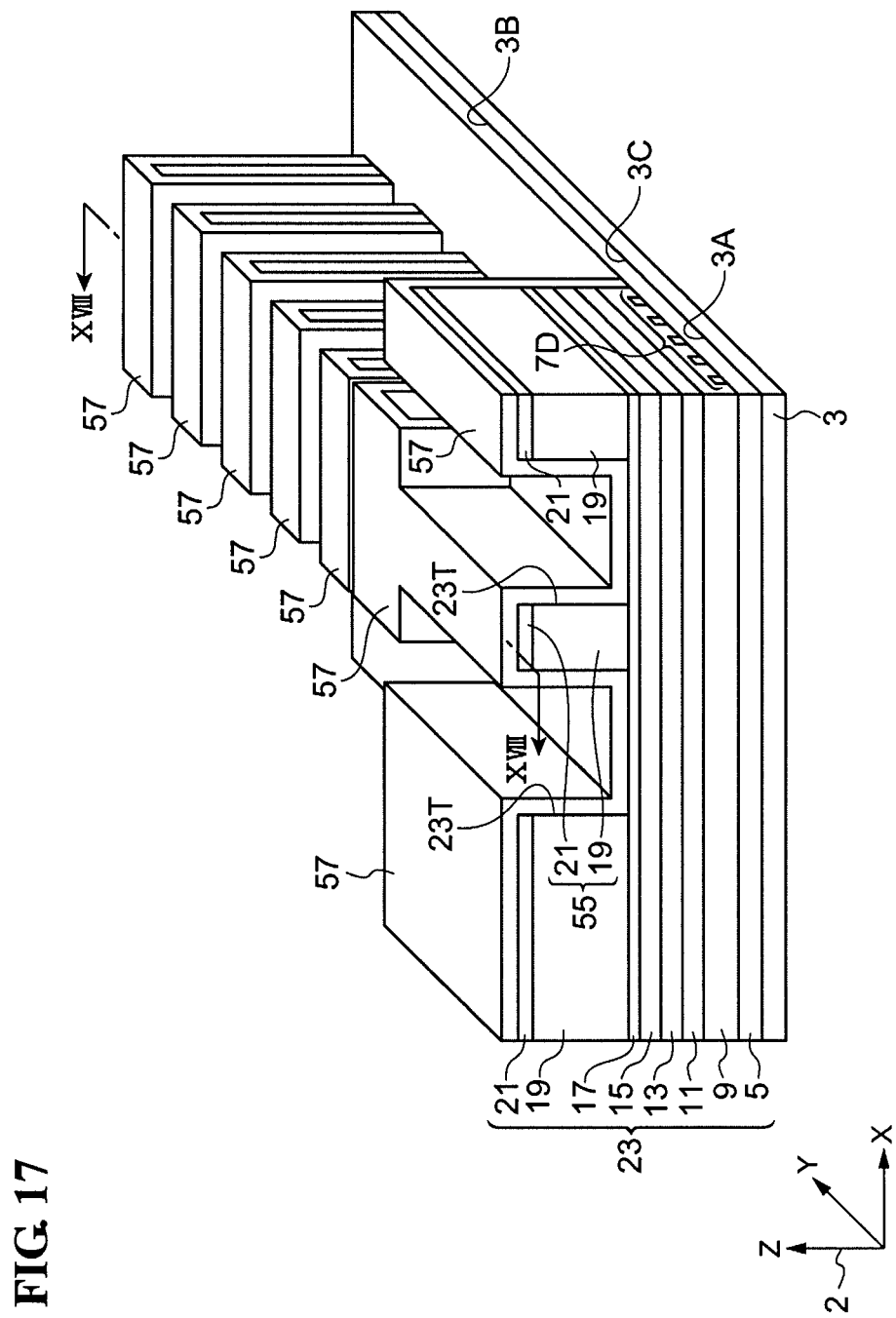
FIG. 17 is yet another perspective view illustrating the method of manufacturing a ridge-type semiconductor laser.
Figure 18:
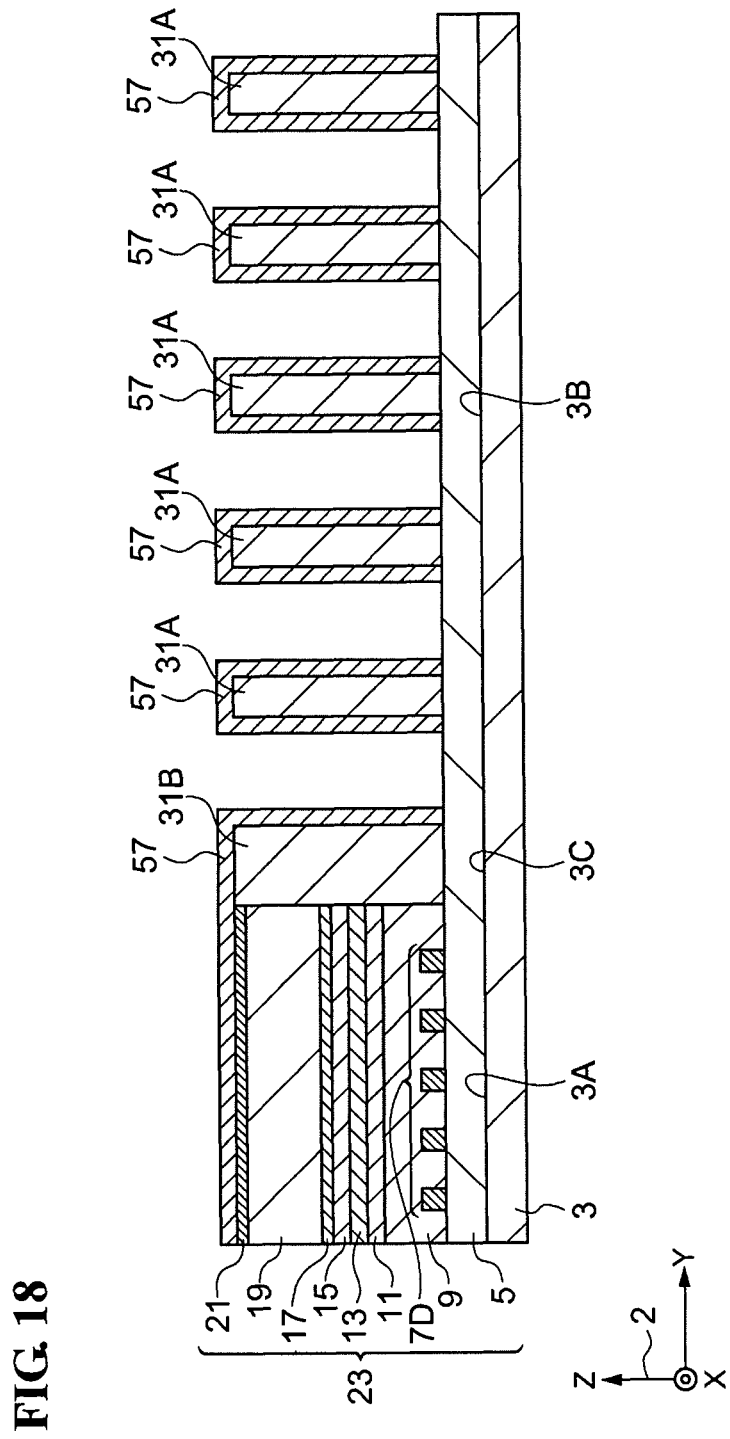
FIG. 18 is yet another sectional view illustrating the method of manufacturing a ridge-type semiconductor laser.
Figure 19:
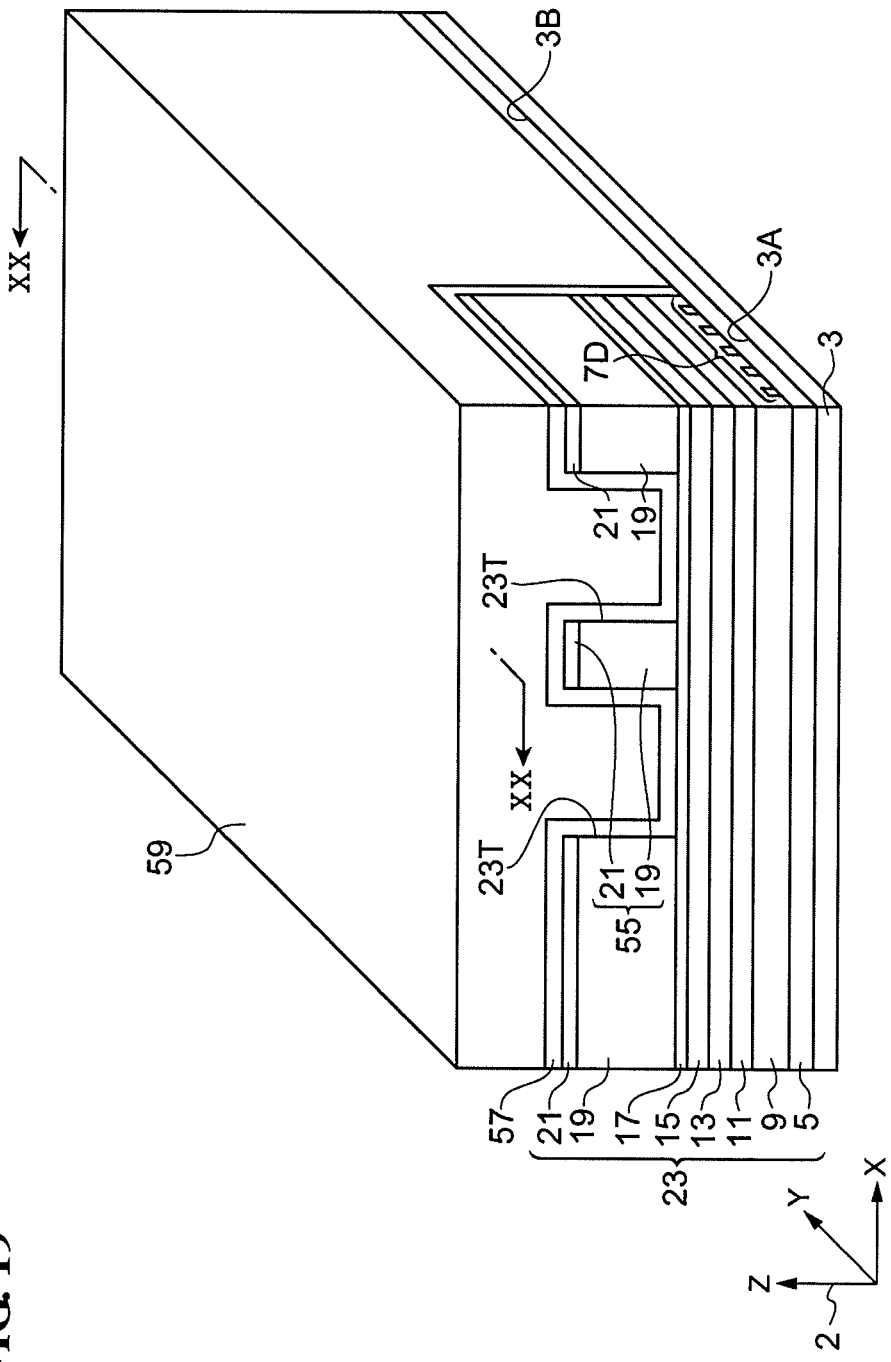
FIG. 19 is yet another perspective view illustrating the method of manufacturing a ridge-type semiconductor laser.

In the present embodiment, referring to FIG. 18, an insulating layer 57 made of a dielectric film such as SiN, SiO$_2$, or the like is formed on exposed surfaces of the semiconductor diffraction grating portions 31A, exposed surfaces of the stacked semiconductor layer 23 (i.e., on surfaces including those of the ridge waveguide portion 55 on both sides in the X-axis-direction and at the top, and those in the stripe grooves 23T), and exposed surfaces of the optical waveguide portion 31B by a CVD method or the like. FIG. 18 is a sectional view taken along line XVIII-XVIII illustrated in FIG. 17.

Resin-Filling Step S15

Subsequently, the resin-filling step S15 is performed. In the resin-filling step S15, a resin layer is formed on and between the plurality of semiconductor diffraction grating portions 31A. Thus, a diffraction grating section including a semiconductor layer and a resin layer is provided.

Figure 20:
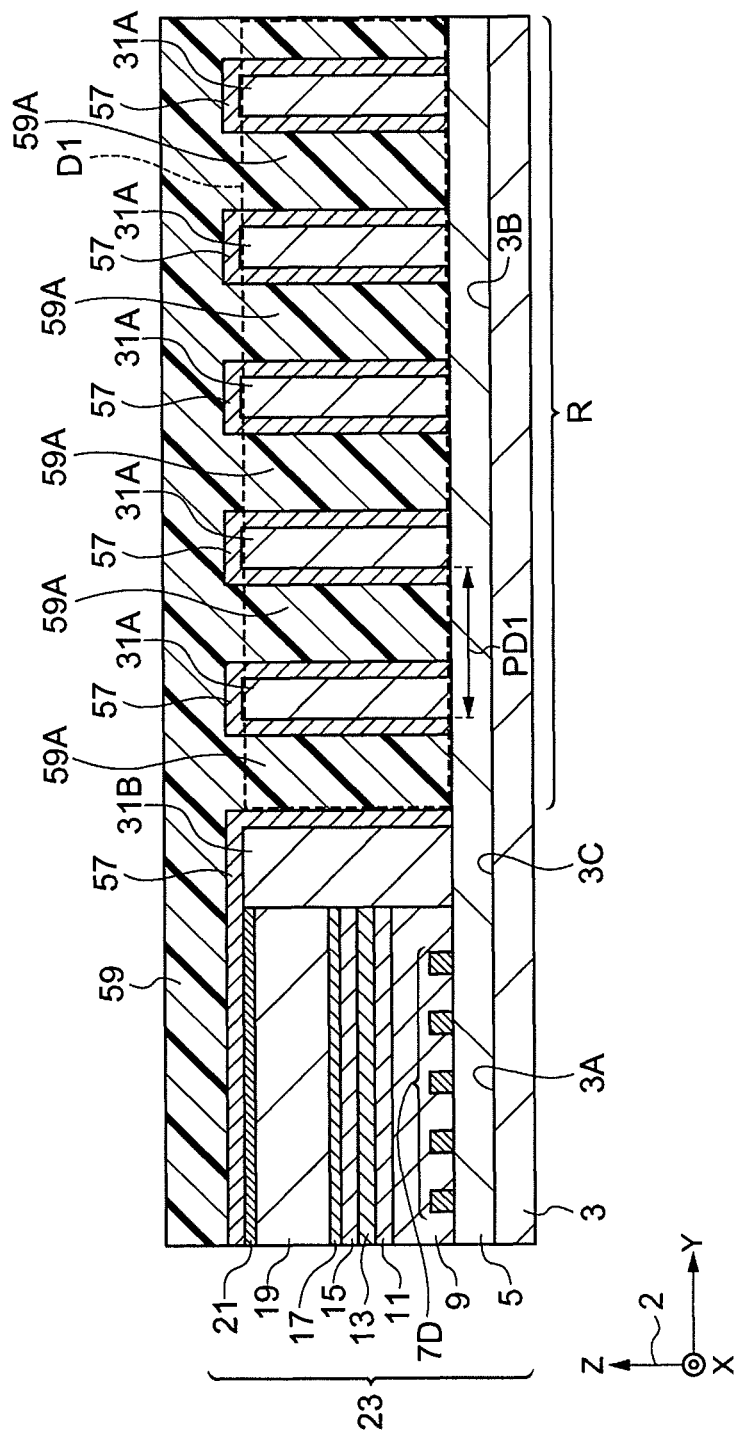
FIG. 20 is yet another sectional view illustrating the method of manufacturing a ridge-type semiconductor laser.
Figure 21:
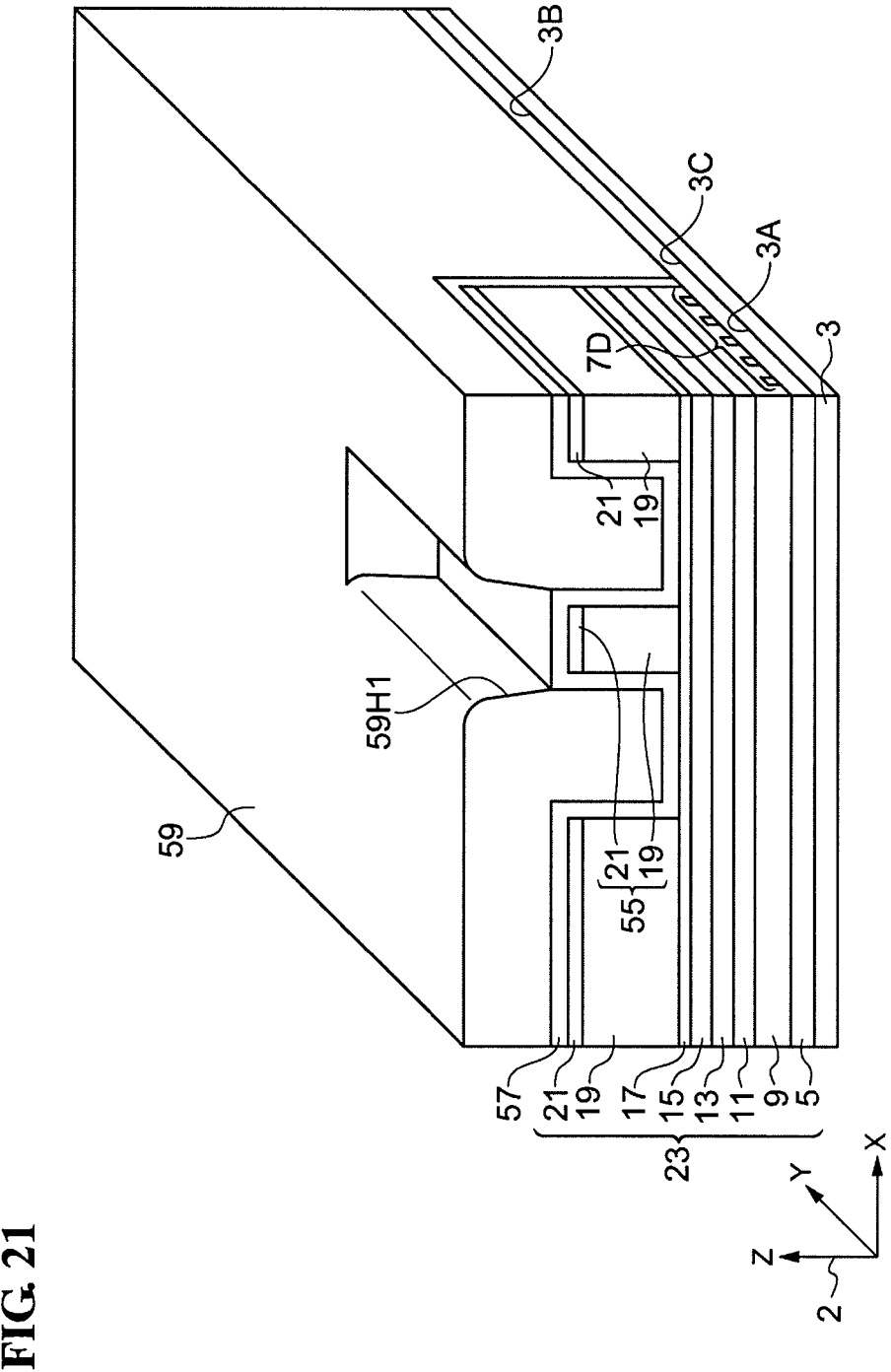
FIG. 21 is yet another perspective view illustrating the method of manufacturing a ridge-type semiconductor laser.

Specifically, referring to FIG. 20, a resin portion 59 is formed on the stacked semiconductor layer 23, the plurality of semiconductor diffraction grating portions 31A, and the optical waveguide portion 31B by using, for example, a resin-coating process in such a manner as to fill the gaps between the foregoing elements. The resin portion 59 is made of, for example, benzocyclobutene (BCB) resin. FIG. 20 is a sectional view taken along line XX-XX illustrated in FIG. 19.

In the present embodiment, the insulating layer 57 is provided on the top surface of the stacked semiconductor layer 23 (including the top surface of the ridge waveguide portion 55 and the surfaces in the stripe grooves 23T), the top and side surfaces of the optical waveguide portion 31B, and the top and side surfaces of the plurality of semiconductor diffraction grating portions 31A. In the present embodiment, the insulating layer 57 is interposed between the resin portion 59 and the stacked semiconductor layer 23, between the resin portion 59 and the semiconductor diffraction grating portions 31A, and between the resin portion 59 and the optical waveguide portion 31B. Since an insulating layer is interposed between the resin and the semiconductor layer (in the present embodiment, the stacked semiconductor layer 23, the semiconductor diffraction grating portions 31A, and the optical waveguide portion 31B), the adhesion property between the resin and the semiconductor layer is improved and the occurrence of, for example, peeling of the resin from the semiconductor layer is suppressed.

A plurality of regions of the resin portion 59 adjoining the individual semiconductor diffraction grating portions 31A in the waveguiding direction (Y-axis direction) function as resin diffraction grating portions 59A. In the present embodiment, the semiconductor diffraction grating portions 31A, the resin diffraction grating portions 59A, and regions of the insulating layer 57 formed between the semiconductor diffraction grating portions 31A and the resin diffraction grating portions 59A in combination form a diffraction grating section D1. The diffraction grating section D1 may alternatively be configured without the insulating layer 57. The semiconductor diffraction grating portions 31A are provided periodically in the Y-axis direction, as described above. That is, the diffraction grating section D1 includes the plurality of semiconductor diffraction grating portions 31A and the plurality of resin diffraction grating portions 59A that are provided alternately and periodically in the Y-axis direction. In the diffraction grating section D1, the refractive index of the semiconductor diffraction grating portions 31A differs from that of the resin diffraction grating portions 59A. Therefore, the effective refractive index of the diffraction grating section D1 varies periodically in the Y-axis direction. Hence, the diffraction grating section D1 functions as a diffraction grating that selectively reflects light at a specific wavelength that is determined by the period of the diffraction grating in the diffraction grating section D1.

In the present embodiment, the diffraction grating section D1 is used as a second-order diffraction grating. The Bragg wavelength (reflection peak wavelength) of the diffraction grating section D1 is, for example, 1300 nm. The diffraction grating section D1 has a period PD1 of, for example, 609 nm as the second-order diffraction grating.

The diffraction grating section D1 is formed as described above. Then, a DBR mirror R including the diffraction grating section D1 provided on the second surface 3B of the semiconductor substrate 3 is provided. Thus, this step is complete.

Subsequently, an electrode-forming step is performed. In this step, referring to FIG. 21, an opening 59H1 extending in the Y-axis direction is provided in the resin portion 59 such that a region of the insulating layer 57 formed on the ridge waveguide portion 55 is exposed. The opening 59H1 is provided by, for example, etching off a region of the resin portion 59 formed on the ridge waveguide portion 55 by a RIE method with a gas mixture of $CF_4$ gas and oxygen ($O_2$) gas.

Figure 22:
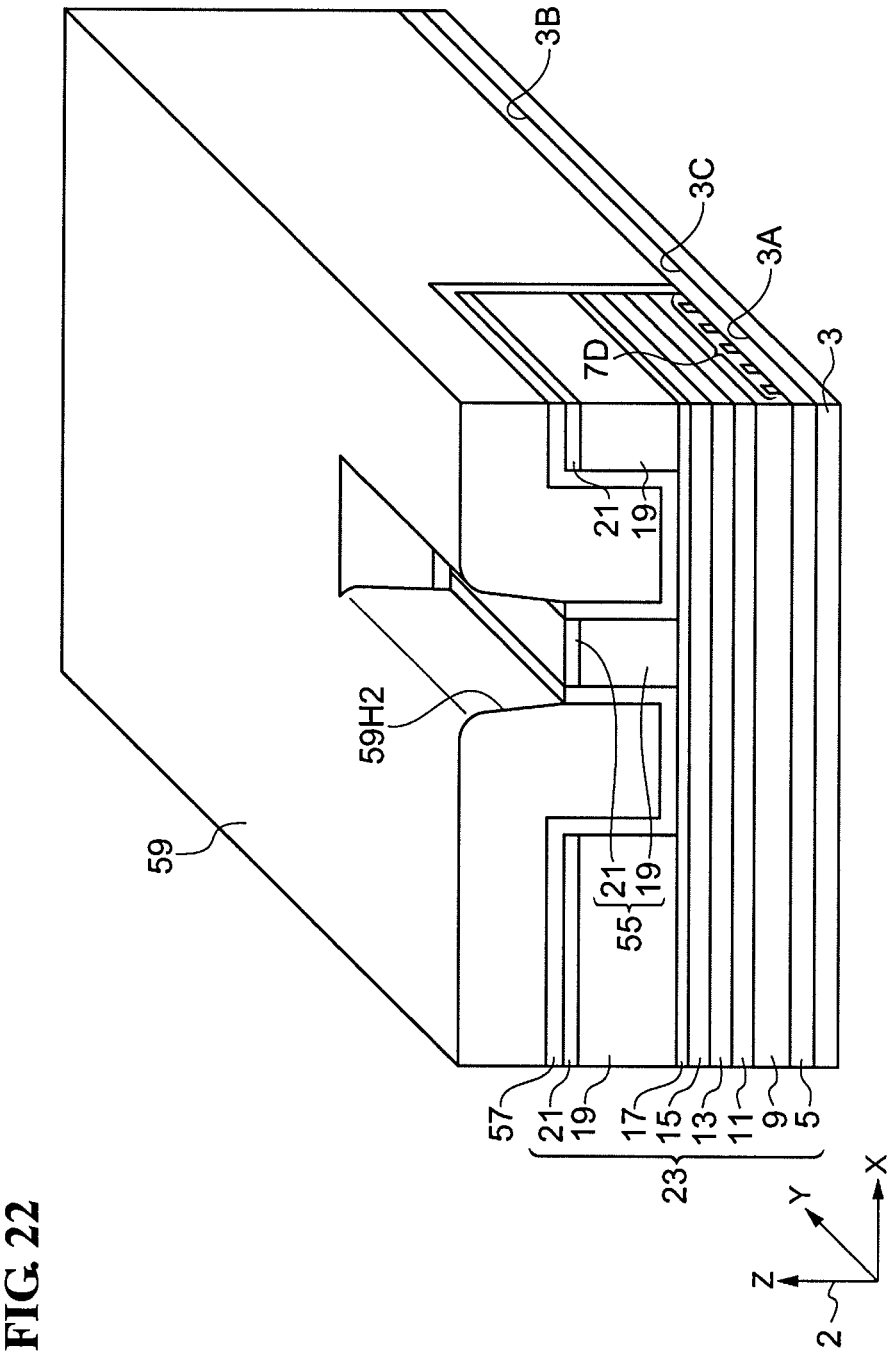
FIG. 22 is yet another perspective view illustrating the method of manufacturing a ridge-type semiconductor laser.

Subsequently, referring to FIG. 22, the region of the insulating layer 57 exposed in the opening 59H1 is etched off by, for example, a RIE method with $CF_4$ gas. Then, an opening 59H2 extending in the Y-axis direction is provided. The opening 59H2 also extends from the surface of the resin portion 59 to the contact layer 21 included in the ridge waveguide portion 55. Thus, the contact layer 21 included in the ridge waveguide portion 55 is exposed.

Subsequently, referring to FIGS. 23 and 24, an upper electrode 61 as an ohmic electrode is formed on a surface of the contact layer 21 included in the ridge waveguide portion 55. Furthermore, an electrode pad 63 is formed on the resin portion 59 in such a manner as to be electrically connected to the upper electrode 61. Furthermore, a lower electrode 65 is formed on a backside of the semiconductor substrate 3. Thus, a ridge-type semiconductor laser portion LD is complete. FIG. 24 is a sectional view taken along line XXIV-XXIV illustrated in FIG. 23.

A ridge-type semiconductor laser 1 according to the present embodiment is complete through the above steps. As illustrated in FIGS. 23 and 24, the ridge-type semiconductor laser 1 includes the ridge-type semiconductor laser portion LD, the DBR mirror R, and the optical waveguide portion 31B. The waveguiding direction of the ridge-type semiconductor laser portion LD corresponds to the Y-axis direction. One end facet E1 of the ridge-type semiconductor laser portion LD in the waveguiding direction faces the DBR mirror R with the optical waveguide portion 31B interposed therebetween. Thus, the end facet E1 of the ridge-type semiconductor laser portion LD is optically connected to the DBR mirror R. A distance TD1 from the second surface 3B of the semiconductor substrate 3 to the diffraction grating section D1 included in the DBR mirror R is shorter than a distance T55 from the first surface 3A of the semiconductor substrate 3 to the ridge waveguide portion 55.

In the above method of manufacturing a ridge-type semiconductor laser according to the above embodiment, when a voltage is applied between the upper electrode 61 and the lower electrode 65 of the ridge-type semiconductor laser 1, a current is injected into the active layer 13 included in the ridge-type semiconductor laser portion LD. As a result, light is emitted from the active layer 13. The light emitted from the active layer 13 propagates in the ridge-type semiconductor laser portion LD in the waveguiding direction (Y-axis direction), and the light is coupled to the diffraction grating 7D provided near the active layer 13 with a coupling coefficient K. Therefore, the light is eventually emitted from the end facet E1 of the ridge-type semiconductor laser portion LD. A wavelength of the light emitted from the end facet E1 of the ridge-type semiconductor laser portion LD is determined by the period of the diffraction grating 7D in the ridge-type semiconductor laser portion LD. The light emitted from the end facet E1 propagates into the diffraction grating section D1 included in the DBR mirror R that is optically connected to the end facet E1. Then, the light is selectively reflected by the diffraction grating section D1, and the light is fed back to the active layer 13 in the ridge-type semiconductor laser portion LD while being amplified in the active layer 13. Consequently, laser light having a single longitudinal mode (single wavelength) is emitted from another end facet E2, in the waveguiding direction.

In the ridge-type semiconductor laser 1 according to the above embodiment, the oscillation wavelength is determined by the diffraction grating 7D included in the ridge-type semiconductor laser portion LD. Laser light having a single longitudinal mode determined by the period of the diffraction grating 7D is emitted from the ridge-type semiconductor laser 1. Here, the diffraction grating section D1 included in the DBR mirror R has a function similar to those of end facet mirrors having high-reflection (HR)-coating in conventional semiconductor lasers, in particular, conventional distributed feedback (DFB) semiconductor lasers. Furthermore, the DBR mirror R of the ridge-type semiconductor laser 1 according to the above embodiment is made of a semiconductor (the semiconductor diffraction grating portions 31A) and a resin (the optical waveguide portion 31B), and the difference in refractive index between the semiconductor and the resin is therefore large.

Hence, the DBR mirror R realizes a reflectivity higher than those of the end facet mirrors with a HR coating. Furthermore, the DBR mirror R has a high reflectivity in the wavelength range wider than those of the end facet mirrors with the FIR coating. That is, the DBR mirror R has high reflectivity over a wide wavelength range. Therefore, even if the wavelength of light emitted from the ridge-type semiconductor laser portion LD changes with any changes in the current injected to the ridge-type semiconductor laser portion LD, any changes in the temperature, or the like, the reflectivity of the DBR mirror R changes little and the high reflectivity is maintained. Hence, the ridge-type semiconductor laser 1 operates stably in a wide current range or in a wide temperature range. Furthermore, the optical waveguide portion 31B is interposed between the ridge-type semiconductor laser portion LD and the DBR mirror R. Therefore, the ridge-type semiconductor laser portion LD and the DBR mirror R are optically connected to each other with low optical loss. Thus, the ridge-type semiconductor laser 1 has a low threshold current density and high emission efficiency.

Since the bandgap energy of the plurality of semiconductor diffraction grating portions 31A included in the diffraction grating section D1 is larger than that of the active layer 13, the absorption of the light emitted from the active layer 13 in the plurality of semiconductor diffraction grating portions 31A included in the DBR mirror R is suppressed. Accordingly, the reduction in the reflectivity of the DBR mirror R due to the absorption of light is suppressed. Consequently, the method of manufacturing a ridge-type semiconductor laser according to the above embodiment provides a ridge-type semiconductor laser including a DBR mirror having high reflectivity.

In the method of manufacturing a ridge-type semiconductor laser according to the above embodiment, the depth (first depth E55) to which the stacked semiconductor layer 23 is etched in the second stacked-semiconductor-layer-etching step S7-3 differs from the depth (second depth E31) to which the semiconductor portion 31 is etched in the first semiconductor-portion-etching step S9-3 (see FIGS. 15 and 16). The stacked semiconductor layer 23 includes the etch stop layer 17, whereas the semiconductor portion 31 does not include any etch stop layer. Furthermore, the etch stop layer 17 is made of a semiconductor material different from that of the semiconductor portion 31. Therefore, if an etching method in which the etching rate of the etch stop layer 17 becomes smaller than that of the semiconductor portion 31 is employed, the second stacked-semiconductor-layer-etching step S7-3 and the first semiconductor-portion-etching step S9-3 can be performed simultaneously. Specifically, the following exemplary ME method may be employed: the etch stop layer 17 is made of an Al-containing III-V group compound semiconductor, the semiconductor portion 31 is made of a non-Al-containing III-V group compound semiconductor, and a gas mixture of $CH_4$ gas and $H_2$ gas is used as etching gas.

Thus, the manufacturing method is simplified compared with a case where the second stacked-semiconductor-layer-etching step S7-3 and the first semiconductor-portion-etching step S9-3 are performed separately. Moreover, since the first-mask-portion-patterning step S7-1 and the second-mask-portion-patterning step S9-1 are performed simultaneously by pattern transfer from the master pattern 40M (see FIGS. 10 to 14), the ridge-type semiconductor laser portion LD and the DBR mirror R are accurately aligned with each other. Here, the first-mask-portion-patterning step S7-1 is performed before the second stacked-semiconductor-layer-etching step S7-3 and the second-mask-portion-patterning step S9-1 is performed before the first semiconductor-portion-etching step S9-3.

Consequently, in the method of manufacturing a ridge-type semiconductor laser according to the above embodiment, the ridge-type semiconductor laser 1 is manufactured accurately and simply.

The method of manufacturing a ridge-type semiconductor laser according to the above embodiment further includes the optical-waveguide-portion-forming step S11 in which the optical waveguide portion 31B is formed above the third surface 3C residing between the first surface 3A and the second surface 3B included in the major surface 3S of the semiconductor substrate 3. Furthermore, in the stacked-semiconductor-layer-forming step S1, the stacked semiconductor layer 23 is formed on the first surface 3A, the second surface 3B, and the third surface 3C (see FIG. 6). Furthermore, in the first stacked-semiconductor-layer-etching step S3, the region of the stacked semiconductor layer 23 formed on the second surface 3B and the third surface 3C is etched off such that at least the portions of the etch stop layer 17 and the active layer 13 included in the foregoing region of the stacked semiconductor layer 23 are removed (see FIG. 8). Furthermore, in the semiconductor-portion-forming step S5, the semiconductor portion 31 is formed on the second surface 3B and the third surface 3C (see FIG. 9).

Furthermore, the optical-waveguide-portion-forming step S11 includes the third-mask-portion-patterning step S11-1 in which the third mask portion 34 formed on the region of the semiconductor portion 31 residing above the third surface 3C is patterned (see FIGS. 10 to 14) and the second semiconductor-portion-etching step S11-3 in which the optical waveguide portion 31B is formed between the ridge-type semiconductor laser portion LD and the DBR mirror R by etching the semiconductor portion 31 with the patterned third mask portion 34P3 as a mask (see FIGS. 15 and 16). Furthermore, the first-mask-portion-patterning step S7-1, the second-mask-portion-patterning step S9-1, and the third-mask-portion-patterning step S11-1 are performed simultaneously by pattern transfer from the master pattern 40M (see FIGS. 10 to 12). Furthermore, the second stacked-semiconductor-layer-etching step S7-3 included in the ridge-waveguide-portion-forming step S7, the first semiconductor-portion-etching step S9-3 included in the semiconductor-diffraction-grating-portion-forming step S9, and the second semiconductor-portion-etching step S11-3 included in the optical-waveguide-portion-forming step S11 are performed simultaneously (see FIGS. 15 and 16). Furthermore, the bandgap energy of the optical waveguide portion 31B is larger than that of the active layer 13.

Therefore, the optical waveguide portion 31B has a refractive index between those of the resin (the resin diffraction grating portions 59A) included in the DBR mirror R and the active layer 13. That is, the difference in refractive index between the optical waveguide portion 31B and the active layer 13 is smaller than that between the resin (the resin diffraction grating portions 59A) included in the DBR mirror R and the active layer 13. Hence, compared with a configuration not including the optical waveguide portion 31B and in which the active layer 13 and the DBR mirror R (or the resin included in the DBR mirror R) are directly connected to each other, the loss of light due to scattering is reduced. Furthermore, since the bandgap energy of the optical waveguide portion 31B is larger than that of the active layer 13, the optical waveguide portion 31B has a small absorption loss. Thus, the active layer 13 and the DBR mirror R are optically connected to each other with a small loss and high efficiency with the presence of the optical waveguide portion 31B. Consequently, the laser output power is increased, and the threshold current density is reduced.

Moreover, the second semiconductor-portion-etching step S11-3 included in the optical-waveguide-portion-forming step S11 is performed simultaneously with the second stacked-semiconductor-layer-etching step S7-3 included in the ridge-waveguide-portion-forming step S7 and the first semiconductor-portion-etching step S9-3 included in the semiconductor-diffraction-grating-portion-forming step S9 (see FIGS. 15 and 16). Therefore, the ridge-type semiconductor laser 1 is manufactured easily even with the addition of the optical-waveguide-portion-forming step S11. Furthermore, the third-mask-portion-patterning step S11-1 included in the optical-waveguide-portion-forming step S11 is performed simultaneously with the first-mask-portion-patterning step S7-1 and the second-mask-portion-patterning step S9-1 by pattern transfer from the master pattern 40M (see FIGS. 10 to 14). Therefore, the ridge-type semiconductor laser portion LD, the DBR mirror R, and the optical waveguide portion 31B are aligned accurately even with the addition of the optical-waveguide-portion-forming step S11 (see FIGS. 15 to 20). Thus, the ridge-type semiconductor laser 1 is manufactured accurately.

In the method of manufacturing a ridge-type semiconductor laser according to the above embodiment, the etch stop layer 17 is made of an Al-containing semiconductor material. Furthermore, the second stacked-semiconductor-layer-etching step S7-3 included in the ridge-waveguide-portion-forming step S7, the first semiconductor-portion-etching step S9-3 included in the semiconductor-diffraction-grating-portion-forming step S9, and the second semiconductor-portion-etching step S11-3 included in the optical-waveguide-portion-forming step S11 are performed by a RIE method with a gas mixture of $CH_4$ gas and $H_2$ gas (see FIGS. 15 and 16).

Therefore, in the second stacked-semiconductor-layer-etching step S7-3, the first semiconductor-portion-etching step S9-3, and the second semiconductor-portion-etching step S11-3, the etching rate of the etch stop layer 17 made of an Al-containing III-V group compound semiconductor is smaller than that of the semiconductor portion 31 made of a non-Al-containing III-V group compound semiconductor. Consequently, the simultaneous performance of the second stacked-semiconductor-layer-etching step S7-3, the first semiconductor-portion-etching step S9-3, and the second semiconductor-portion-etching step S11-3 is facilitated (see FIGS. 15 and 16).

In the method of manufacturing a ridge-type semiconductor laser according to the above embodiment, the thickness of the etch stop layer 17 is preferably 100 nm or more and 150 nm or less. If the thickness of the etch stop layer 17 is set to 100 nm or more, the layers included in the stacked semiconductor layer 23 residing below the etch stop layer 17 are easily prevented from being etched during the simultaneous performance of the second stacked-semiconductor-layer-etching step S7-3, the first semiconductor-portion-etching step S9-3, and the second semiconductor-portion-etching step S11-3. If the thickness of the etch stop layer 17 is set to 150 nm or less, the increase in the resistance of the stacked semiconductor layer 23 is suppressed well.

The method of manufacturing a ridge-type semiconductor laser according to the above embodiment further includes, after the semiconductor-diffraction-grating-portion-forming step S9 and before the resin-filling step S15, the insulating-layer-forming step S13 in which the insulating layer 57 is formed on the exposed surfaces of the semiconductor diffraction grating portions 31A (see FIGS. 17 and 18). Thus, the insulating layer 57 is interposed between the semiconductor diffraction grating portions 31A and the resin diffraction grating portions 59A (see FIG. 20). Consequently, the occurrence of peeling of the resin diffraction grating portions 59A from the semiconductor diffraction grating portions 31A is suppressed.

In the ridge-type semiconductor laser 1 according to the above embodiment, the light generated in the active layer 13 included in the ridge-type semiconductor laser portion LD is emitted from the end facet E1, in the waveguiding direction, of the ridge-type semiconductor laser portion LD and enters the DBR mirror R that is optically connected to the end facet E1. Light propagating into the DBR mirror R is selectively reflected by the diffraction grating section D1 included in the DBR mirror R and is fed back to the active layer 13. Then, laser oscillation with a single longitudinal mode (single wavelength) occurs (see FIGS. 23 and 24). The bandgap energy of the plurality of semiconductor diffraction grating portions 31A included in the diffraction grating section D1 is larger than that of the active layer 13. Therefore, the absorption of the light emitted from the active layer 13 in the plurality of semiconductor diffraction grating portions 31A is suppressed. Accordingly, the reduction in the reflectivity of the DBR mirror R due to the absorption of light in the semiconductor diffraction grating portions 31A is suppressed. Consequently, the reflectivity of the DBR mirror R included in the ridge-type semiconductor laser 1 according to the above embodiment becomes high.

The ridge-type semiconductor laser 1 according to the above embodiment further includes the optical waveguide portion 31B provided between the end facet E1 of the ridge-type semiconductor laser portion LD and the DBR mirror R. Furthermore, the bandgap energy of the optical waveguide portion 31B is larger than that of the active layer 13 (see FIGS. 23 and 24). In such a case, the optical waveguide portion 31B has a refractive index between those of the resin (the resin diffraction grating portions 59A) included in the DBR mirror R and the active layer 13. That is, the difference in refractive index between the optical waveguide portion 31B and the active layer 13 is smaller than that between the resin (the resin diffraction grating portions 59A) included in the DBR mirror R and the active layer 13.

Hence, compared with a configuration not including the optical waveguide portion 31B and in which the active layer 13 and the DBR mirror R (or the resin included in the DBR mirror R) are directly connected to each other, the loss of light due to scattering is reduced. Furthermore, since the bandgap energy of the optical waveguide portion 31B is larger than that of the active layer 13, the optical waveguide portion 31B has a small absorption loss. Consequently, the laser output power is increased, and the threshold current density is reduced.

In the ridge-type semiconductor laser 1 according to the above embodiment, the length of the optical waveguide portion 31B in the waveguiding direction (the length in the Y-axis direction) is preferably 2 μm or more and 5 μm or less (see FIG. 24). If the length is 2 μm or more, the effect of reducing the loss of light due to scattering is pronounced. If the length is 5 μm or less, the absorption of light by the optical waveguide portion 31B itself is suppressed well.

In the ridge-type semiconductor laser 1 according to the above embodiment, the diffraction grating section D1 included in the DBR mirror R has a second-order diffraction grating. Therefore, the period of the plurality of semiconductor diffraction grating portions 31A and the plurality of resin diffraction grating portions 59A provided alternately in the diffraction grating section D1 included in the DBR mirror R can be increased. This facilitates the manufacturing of the DBR mirror R.

In the ridge-type semiconductor laser 1 according to the above embodiment, the ridge-type semiconductor laser portion LD includes the diffraction grating 7D whose refractive index varies periodically in the waveguiding direction (see FIGS. 23 and 24). Thus, the wavelength of light emitted from the ridge-type semiconductor laser 1 is determined by the period of the diffraction grating 7D included in the ridge-type semiconductor laser portion LD. Laser light having a single longitudinal mode determined by the period of the diffraction grating 7D is emitted. Furthermore, the DBR mirror R has high reflectivity over a wide wavelength range. Therefore, even if the wavelength of light emitted from the ridge-type semiconductor laser portion LD changes with any changes in the current injected to the ridge-type semiconductor laser portion LD, any changes in the temperature, or the like, the reflectivity of the DBR mirror R changes little. Hence, the ridge-type semiconductor laser 1 operates stably in a wide current range or in a wide temperature range.

In the ridge-type semiconductor laser 1 according to the above embodiment, the length W31A of each semiconductor diffraction grating portion 31A in the direction (the X-axis direction) orthogonal to the waveguiding direction is larger than the length W55 of the ridge waveguide portion 55 in the X-axis direction. Furthermore, the length W31B of the optical waveguide portion 31B in the X-axis direction is larger than the length W55 of the ridge waveguide portion 55 in the X-axis direction (see FIG. 15).

Thus, even if the light emitted from the active layer 13 has a size larger than the length W55 of the ridge waveguide portion 55 and is guided toward the optical waveguide portion 31B and the DBR mirror R, most of the light reaches the optical waveguide portion 31B and the DBR mirror R. Consequently, the laser output power is increased, and the threshold current density is reduced.

The present invention is not limited to the above embodiment, and various modifications can be made thereto.

For example, although the method of manufacturing a ridge-type semiconductor laser according to the above embodiment includes the insulating-layer-forming step S13 (see FIGS. 17 and 18), the insulating-layer-forming step S13 may be omitted.

For another example, although the method of manufacturing a ridge-type semiconductor laser according to the above embodiment includes the optical-waveguide-portion-forming step S11 (see FIGS. 15 and 16), the optical-waveguide-portion-forming step S11 may be omitted. In that case, the end facet E1 of the stacked semiconductor layer 23 and the DBR mirror R may be directly in contact with each other for optical connection.

For yet another example, even if the length W31A of each semiconductor diffraction grating portion 31A in the X-axis direction that is orthogonal to the waveguiding direction is the same as or smaller than the length W55 of the ridge waveguide portion 55 in the X-axis direction, the present invention can be embodied.

For yet another example, even if the length W31B of the optical waveguide portion 31B in the X-axis direction is the same as or smaller than the length W55 of the ridge waveguide portion 55 in the X-axis direction, the present invention can be embodied.

For yet another example, although the ridge-type semiconductor laser 1 according to the above embodiment includes the optical waveguide portion 31B (see FIG. 24), the optical waveguide portion 31B may be omitted. In that case, the end facet E1 of the stacked semiconductor layer 23 and the DBR mirror R may be directly in contact with each other for optical connection.

For yet another example, although the ridge-type semiconductor laser portion LD according to the above embodiment includes the diffraction grating 7D below the active layer 13, the ridge-type semiconductor laser portion LD may include the diffraction grating 7D above the active layer 13, or the diffraction grating 7D may be omitted.

For yet another example, the ridge-type semiconductor laser 1 may be a so-called DBR semiconductor laser that does not include the diffraction grating 7D. In that case, the active layer 13, the DBR mirror R, and the end facet E2 in combination form a laser cavity.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method of manufacturing a ridge-type semiconductor laser comprising the steps of:
    forming a stacked semiconductor layer on a semiconductor substrate having a major surface including a first surface and a second surface that are provided in that order in a waveguiding direction, the stacked semiconductor layer including an active layer and an etch stop layer provided above the active layer;
    etching at least a portion of the etch stop layer and a portion of the active layer of the stacked semiconductor layer formed on the second surface;
    forming a semiconductor portion on the second surface where the stacked semiconductor layer is etched off;
    forming a ridge waveguide portion in the stacked semiconductor layer by etching a region of the stacked semiconductor layer formed on the first surface to a first depth reaching the etch stop layer;
    forming a plurality of semiconductor diffraction grating portions by etching a region of the semiconductor portion formed on the second surface to a second depth larger than the first depth, the plurality of semiconductor diffraction grating portions being formed periodically in the waveguiding direction; and
    forming a diffraction grating section including the plurality of semiconductor diffraction grating portions and a plurality of resin diffraction grating portions, the plurality of resin diffraction grating portions being formed by providing a resin layer over and between the plurality of semiconductor diffraction grating portions,
    wherein the step of forming the ridge waveguide portion includes
        forming and patterning a first mask portion on the stacked semiconductor layer; and
        selectively etching the stacked semiconductor layer to the etch stop layer by using the patterned first mask portion as a mask,
    wherein the step of forming the semiconductor diffraction grating portions includes
        forming and patterning a second mask portion on the semiconductor portion; and
        etching the semiconductor portion by using the patterned second mask portion as a mask, and
    wherein the etching of the stacked semiconductor layer in the step of forming the ridge waveguide portion and the etching of the semiconductor portion in the step of forming the semiconductor diffraction grating portions are performed simultaneously.

2. The method of manufacturing a ridge-type semiconductor laser according to claim 1, wherein the patterning of the first mask portion in the step of forming the ridge waveguide portion and the patterning of the second mask portion in the step of forming the semiconductor diffraction grating portions are performed simultaneously by pattern transfer from one master pattern.

3. The method of manufacturing a ridge-type semiconductor laser according to claim 1,
    wherein the etch stop layer is made of a semiconductor material different from a material of the semiconductor portion, and
    wherein the etching of the stacked semiconductor layer in the step of forming the ridge waveguide portion and the etching of the semiconductor portion in the step of forming the semiconductor diffraction grating portions are performed by a method in which an etching rate of the etch stop layer becomes smaller than an etching rate of the semiconductor portion.

4. The method of manufacturing a ridge-type semiconductor laser according to claim 1,
wherein the etch stop layer is made of an aluminum-containing semiconductor material, and the semiconductor portion is made of a non-aluminum-containing semiconductor material, and
wherein the etching of the stacked semiconductor layer in the step of forming the ridge waveguide portion and the etching of the semiconductor portion in the step of forming the semiconductor diffraction grating portions are performed by a reactive ion etching method with a gas mixture of methane gas and hydrogen gas.

5. The method of manufacturing a ridge-type semiconductor laser according to claim 1, further comprising a step of forming an insulating layer on exposed surfaces of the semiconductor diffraction grating portions after the step of forming the semiconductor diffraction grating portions.

6. The method of manufacturing a ridge-type semiconductor laser according to claim 1, wherein, in the step of forming the semiconductor diffraction grating portions, the semiconductor diffraction grating portions are provided with a period with which the diffraction grating section functions as a second-order diffraction grating.

7. The method of manufacturing a ridge-type semiconductor laser according to claim 1, wherein the etch stop layer has a thickness of 100 nm or more and 150 nm or less.

8. The method of manufacturing a ridge-type semiconductor laser according to claim 1, further comprising a step of forming a diffraction grating on the first surface,
wherein the diffraction grating has a period different from a period of the semiconductor diffraction grating portions.

9. A method of manufacturing a ridge-type semiconductor laser comprising the steps of:
forming a stacked semiconductor layer on a semiconductor substrate having a major surface including a first surface and a second surface that are provided in that order in a waveguiding direction and a third surface interposed between the first surface and the second surface, the stacked semiconductor layer including an active layer and an etch stop layer provided above the active layer;
etching at least a portion of the etch stop layer and a portion of the active layer of the stacked semiconductor layer formed on the second surface and the third surface;
forming a semiconductor portion on the second surface and the third surface where the stacked semiconductor layer is etched off;
forming a ridge waveguide portion in the stacked semiconductor layer by etching a region of the stacked semiconductor layer formed on the first surface to a first depth reaching the etch stop layer;
forming an optical waveguide portion by etching a region of the semiconductor portion formed on the third surface, the optical waveguide portion extending in the waveguiding direction;
forming a plurality of semiconductor diffraction grating portions by etching a region of the semiconductor portion formed on the second surface to a second depth larger than the first depth, the plurality of semiconductor diffraction grating portions being formed periodically in the waveguiding direction; and
forming a diffraction grating section including the plurality of semiconductor diffraction grating portions and a plurality of resin diffraction grating portions, the plurality of resin diffraction grating portions being formed by providing a resin layer over and between the plurality of semiconductor diffraction grating portions,
wherein the step of forming the ridge waveguide portion includes
forming and patterning a first mask portion on the stacked semiconductor layer; and
selectively etching the stacked semiconductor layer to the etch stop layer by using the patterned first mask portion as a mask,
wherein the step of forming the semiconductor diffraction grating portions includes
forming and patterning a second mask portion on the semiconductor portion disposed on the second surface; and
etching the semiconductor portion by using the patterned second mask portion as a mask,
wherein the step of forming the optical waveguide portion includes
forming and patterning a third mask portion on the semiconductor portion disposed on the third surface; and
etching the semiconductor portion by using the patterned third mask portion as a mask,
wherein the patterning of the first mask portion, the patterning of the second mask portion, and the patterning of the third mask portion are performed simultaneously by pattern transfer from one master pattern, and
wherein the etching of the stacked semiconductor layer in the step of forming the ridge waveguide portion, the etching of the semiconductor portion in the step of forming the semiconductor diffraction grating portions, and the etching of the semiconductor portion in the step of forming the optical waveguide portion are performed simultaneously.

10. The method of manufacturing a ridge-type semiconductor laser according to claim 9,
wherein the etch stop layer is made of a semiconductor material different from a material of the semiconductor portion, and
wherein the etching of the stacked semiconductor layer in the step of forming the ridge waveguide portion, the etching of the semiconductor portion in the step of forming the semiconductor diffraction grating portions, and the etching of the semiconductor portion in the step of forming the optical waveguide portion are performed by a method in which an etching rate of the etch stop layer included in the stacked semiconductor layer becomes smaller than an etching rate of the semiconductor portion.

11. The method of manufacturing a ridge-type semiconductor laser according to claim 9,
wherein the etch stop layer is made of an aluminum-containing semiconductor material, and the semiconductor portion is made of a non-aluminum-containing semiconductor material, and
wherein the etching of the stacked semiconductor layer in the step of forming the ridge waveguide portion, the etching of the semiconductor portion in the step of forming the semiconductor diffraction grating portions, and the etching of the semiconductor portion in the step of forming the optical waveguide portion are performed by a reactive ion etching method with a gas mixture of methane gas and hydrogen gas.

12. The method of manufacturing a ridge-type semiconductor laser according to claim 9, wherein the first mask portion, the second mask portion, and the third mask portion have patterns configured such that the semiconductor diffraction grating portions formed with a corresponding one of the patterns each have a length larger than a length of the ridge waveguide portion in a direction orthogonal to the waveguiding direction and such that the optical waveguide portion has a length larger than the length of the ridge waveguide portion in the direction orthogonal to the waveguiding direction.

* * * * *